(12) United States Patent
Katayama

(10) Patent No.: US 12,270,943 B2
(45) Date of Patent: Apr. 8, 2025

(54) LIGHT RECEIVING ELEMENT, DISTANCE MEASUREMENT MODULE, AND ELECTRONIC DEVICE

(71) Applicant: SONY SEMICONDUCTOR SOLUTIONS CORPORATION, Kanagawa (JP)

(72) Inventor: Hiroshi Katayama, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 1056 days.

(21) Appl. No.: 17/252,779

(22) PCT Filed: Jun. 21, 2019

(86) PCT No.: PCT/JP2019/024640
§ 371 (c)(1),
(2) Date: Dec. 16, 2020

(87) PCT Pub. No.: WO2020/008907
PCT Pub. Date: Jan. 9, 2020

(65) Prior Publication Data
US 2021/0255282 A1  Aug. 19, 2021

(30) Foreign Application Priority Data

Jul. 6, 2018 (JP) .................................. 2018-129113

(51) Int. Cl.
*H01L 27/146* (2006.01)
*G01S 7/481* (2006.01)
(Continued)

(52) U.S. Cl.
CPC .......... *G01S 7/4816* (2013.01); *G01S 7/4814* (2013.01); *G01S 17/46* (2013.01);
(Continued)

(58) Field of Classification Search
CPC ...... G01S 7/4816; G01S 7/4814; G01S 17/46; G01S 7/4863; G01S 7/4914; G01S 17/36;
(Continued)

(56) References Cited

U.S. PATENT DOCUMENTS

2005/0168608 A1    8/2005  Fossum
2008/0153193 A1*   6/2008  Lyu ..................... H01L 27/1463
                                                        438/59
(Continued)

FOREIGN PATENT DOCUMENTS

CN    1629706 A    6/2005
CN    1669144 A    9/2005
(Continued)

OTHER PUBLICATIONS

International Search Report prepared by the Japan Patent Office on Aug. 22, 2019, for International Application No. PCT/JP2019/024640.

*Primary Examiner* — Samuel Park
(74) *Attorney, Agent, or Firm* — Sheridan Ross PC

(57) ABSTRACT

The present technology relates to a light receiving element, a distance measurement module, and an electronic device that enable signal degradation during charge transfer to be reduced. The light receiving element includes a pixel at least including: a first charge holding unit and a second charge holding unit each of which holds an electric charge generated by a photodiode; a first transfer transistor that transfers the electric charge to the first charge holding unit; and a second transfer transistor that transfers the electric charge to the second charge holding unit, in which the first and second transfer transistors each include a vertical transistor including a vertical gate electrode portion. The present technology (Continued)

can be applied to, for example, a light receiving element that performs distance measurement by an indirect ToF method, and the like.

20 Claims, 23 Drawing Sheets

(51) Int. Cl.
  *G01S 17/46* (2006.01)
  *H01L 27/148* (2006.01)
  *H04N 25/771* (2023.01)
(52) U.S. Cl.
  CPC .. *H01L 27/14612* (2013.01); *H01L 27/14856* (2013.01); *H04N 25/771* (2023.01)
(58) Field of Classification Search
  CPC ............. G01S 17/894; H01L 27/14612; H01L 27/14856; H01L 27/14603; H01L 27/14609; H01L 27/146; H04N 25/771; H04N 25/77; G01C 3/08; G01C 3/06
  See application file for complete search history.

(56) References Cited

U.S. PATENT DOCUMENTS

| | | | |
|---|---|---|---|
| 2008/0265352 A1 | 10/2008 | Akiyoshi | |
| 2010/0039546 A1* | 2/2010 | Cohen | H01L 27/14603 348/46 |
| 2011/0187911 A1 | 8/2011 | Shinohara | |
| 2015/0130902 A1 | 5/2015 | Fossum | |
| 2017/0212221 A1 | 7/2017 | Goden et al. | |
| 2017/0221220 A1 | 8/2017 | Fossum | |
| 2017/0280080 A1 | 9/2017 | Machida et al. | |
| 2018/0294304 A1* | 10/2018 | Janssens | H04N 25/75 |

FOREIGN PATENT DOCUMENTS

| | | |
|---|---|---|
| CN | 101281922 A | 10/2008 |
| CN | 102971852 A | 3/2013 |
| CN | 103856728 A | 6/2014 |
| CN | 105934826 A | 9/2016 |
| CN | 106461781 A | 2/2017 |
| EP | 2803184 A1 | 2/2020 |
| JP | 2008-258316 | 10/2008 |
| JP | 2009008537 A | 1/2009 |
| JP | 2011-159756 | 8/2011 |
| JP | 2012-083214 | 4/2012 |
| JP | 2013-021169 | 1/2013 |
| JP | 2017-135168 | 8/2017 |
| KR | 20080090295 A | 10/2008 |
| TW | 200427078 A | 12/2004 |
| WO | WO 2016/098624 | 6/2016 |
| WO | WO 2018/100998 | 6/2018 |

* cited by examiner

LIGHT RECEIVING ELEMENT, DISTANCE MEASUREMENT MODULE, AND ELECTRONIC DEVICE

CROSS REFERENCE TO RELATED APPLICATIONS

This application is a national stage application under 35 U.S.C. 371 and claims the benefit of PCT Application No. PCT/JP2019/024640 having an international filing date of 21 Jun. 2019, which designated the United States, which PCT application claimed the benefit of Japanese Patent Application No. 2018-129113, filed 6 Jul. 2018, the entire disclosures of each of which are incorporated herein by reference.

TECHNICAL FIELD

The present technology relates to a light receiving element, a distance measurement module, and an electronic device, and more particularly to a light receiving element, a distance measurement module, and an electronic device enabled to reduce signal degradation during charge transfer.

BACKGROUND ART

A semiconductor detection element is known that measures a distance to an object by a Time of Flight (ToF) method. In a ToF method semiconductor detection element, light emitted from a light source hits an object and is reflected, and reflected light is photoelectrically converted by a photodiode. A signal charge generated by photoelectric conversion is distributed to two floating diffusions (FDs) by a pair of alternately driven gate electrodes (see, for example, Patent Document 1).

CITATION LIST

Patent Document

Patent Document 1: Japanese Patent Application National Publication (Laid-Open) No. 2007-526448

SUMMARY OF THE INVENTION

Problems to be Solved by the Invention

In a semiconductor detection element using the pair of gate electrodes structure described above, it is required to reduce signal degradation due to return to the photodiode of the signal charge during transfer when one of the gate electrodes turned on is turned off.

The present technology has been made in view of such a situation, and it is intended to make it possible to reduce signal degradation during charge transfer.

Solutions to Problems

A light receiving element of a first aspect of the present technology includes a pixel at least including: a first charge holding unit and a second charge holding unit each of which holds an electric charge generated by a photodiode; a first transfer transistor that transfers the electric charge to the first charge holding unit; and a second transfer transistor that transfers the electric charge to the second charge holding unit, in which the first and second transfer transistors each include a vertical transistor including a vertical gate electrode portion.

A distance measurement module of a second aspect of the present technology includes: a light receiving element including a pixel at least including a first charge holding unit and a second charge holding unit each of which holds an electric charge generated by a photodiode, a first transfer transistor that transfers the electric charge to the first charge holding unit, and a second transfer transistor that transfers the electric charge to the second charge holding unit, in which the first and second transfer transistors each include a vertical transistor including a vertical gate electrode portion; a light source that emits irradiation light whose brightness fluctuates periodically; and a light emission control unit that controls an irradiation timing of the irradiation light.

An electronic device of a third aspect of the present technology includes a light receiving element including a pixel at least including: a first charge holding unit and a second charge holding unit each of which holds an electric charge generated by a photodiode; a first transfer transistor that transfers the electric charge to the first charge holding unit; and a second transfer transistor that transfers the electric charge to the second charge holding unit, in which the first and second transfer transistors each include a vertical transistor including a vertical gate electrode portion.

In the first to third aspects of the present technology, the pixel at least is provided with: the first charge holding unit and the second charge holding unit each of which holds the electric charge generated by the photodiode; the first transfer transistor that transfers the electric charge to the first charge holding unit; and the second transfer transistor that transfers the electric charge to the second charge holding unit, in which the first and second transfer transistors each include the vertical transistor including a vertical gate electrode portion.

The light receiving element, the distance measurement module, and the electronic device may be an independent device or a module incorporated in another device.

Effects of the Invention

According to the first to third aspects of the present technology, it is possible to reduce signal degradation during charge transfer.

Note that, the effect described here is not necessarily limited, and can be any effect described in the present disclosure.

MODE FOR CARRYING OUT THE INVENTION

Figure 1:
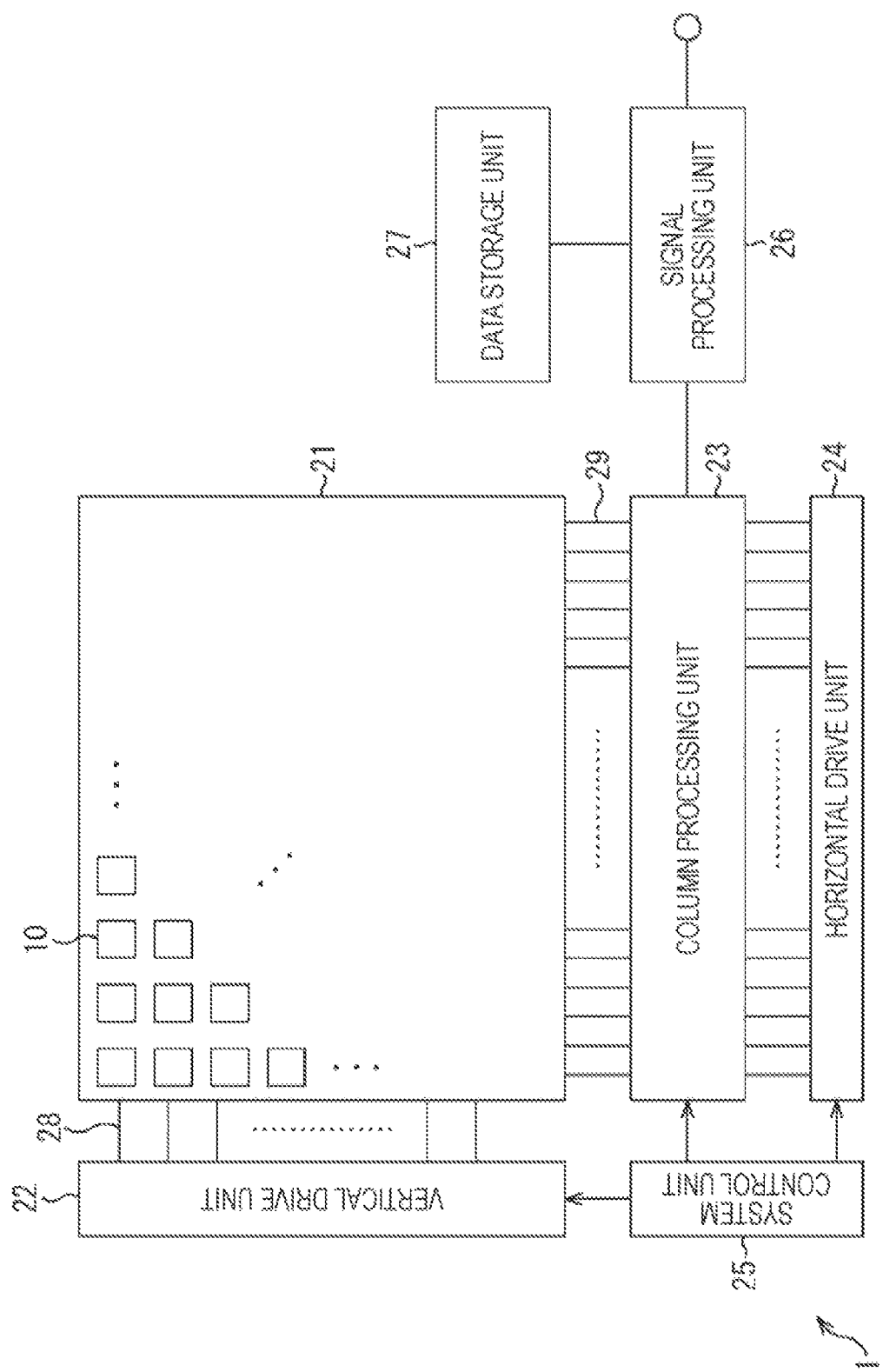
FIG. 1 is a block diagram illustrating a schematic configuration example of a light receiving element to which the present technology is applied.

The following is a description of a mode for carrying out the present technology (the mode will be hereinafter referred to as the embodiment). Note that, the description will be made in the following order.

1. Configuration example of light receiving element
2. Equivalent circuit of pixel
3. Plan view of pixel
4. Cross-sectional view of pixel
5. Effect of vertical transistor
6. Planar shape of vertical gate electrode portion
7. Arrangement example of multiple pixels
8. Drive of transfer transistor
9. Arrangement example of wiring layer
10. Modification of pixel
11. Configuration example of pixel with four taps
12. Application to electric field control type light receiving element
13. Configuration example of distance measurement module
14. Configuration example of electronic device
15. Application example to endoscopic surgical system
16. Application example to mobile body <1. Configuration Example of Light Receiving Element>

FIG. 1 is a block diagram illustrating a schematic configuration example of a light receiving element to which the present technology is applied.

A light receiving element 1 illustrated in FIG. 1 is an element that outputs distance measurement information by an indirect ToF method.

The light receiving element 1 receives light (reflected light) obtained by causing light (irradiation light) emitted from a predetermined light source to hit an object and to be reflected by the object, and outputs a depth image in which distance information to the object is stored as a depth value. Note that, the irradiation light emitted from the light source is, for example, infrared light having a wavelength in a range of 780 nm to 1000 nm, and is pulsed light whose on/off is repeated at a predetermined period.

The light receiving element 1 includes a pixel array unit 21 formed on a semiconductor substrate (not illustrated) and a peripheral circuit unit integrated on the same semiconductor substrate as that on which the pixel array unit 21 is formed. The peripheral circuit unit includes, for example, a vertical drive unit 22, a column processing unit 23, a horizontal drive unit 24, a system control unit 25, and the like.

The light receiving element 1 is further provided with a signal processing unit 26 and a data storage unit 27. Note that, the signal processing unit 26 and the data storage unit 27 may be mounted on the same substrate as that on which the light receiving element 1 is mounted, or may be arranged on a substrate in an imaging device different from the light receiving element 1.

The pixel array unit 21 has a configuration in which pixels 10 are two-dimensionally arranged in a matrix in a row direction and a column direction, the pixels each generating an electric charge corresponding to an amount of light received and outputting a signal corresponding to the electric charge. In other words, the pixel array unit 21 includes the plurality of pixels 10 each performing photoelectric conversion of incident light and outputting the signal corresponding to the electric charge obtained as a result of the photoelectric conversion. Details of the pixels 10 will be described later in FIG. 2 or later.

Here, the row direction means an arrangement direction of the pixels 10 in the horizontal direction, and the column direction means an arrangement direction of the pixels 10 in the vertical direction. The row direction is the lateral direction in the figure, and the column direction is the longitudinal direction in the figure.

In the pixel array unit 21, with respect to a matrix-like pixel arrangement, a pixel drive line 28 is wired along the row direction for each of pixel rows, and two vertical signal lines 29 are wired along the column direction for each of pixel columns. For example, the pixel drive line 28 transmits a drive signal for performing drive during reading of a signal from each of the pixels 10. Note that, in FIG. 1, the pixel drive line 28 is illustrated as one wiring line, but the wiring line is not limited to one wiring line. One end of the pixel drive line 28 is connected to an output end corresponding to each row of the vertical drive unit 22.

The vertical drive unit 22 includes a shift register, an address decoder, and the like, and drives each pixel 10 of the pixel array unit 21 at the same time for all pixels, or on a column basis or the like. In other words, the vertical drive unit 22, together with the system control unit 25 that controls the vertical drive unit 22, constitutes a drive unit that controls operation of each pixel 10 of the pixel array unit 21.

A detection signal output from each pixel 10 of the pixel rows depending on drive control by the vertical drive unit 22 is input to the column processing unit 23 through the vertical signal line 29. The column processing unit 23 performs predetermined signal processing on the detection signal output from each pixel 10 through the vertical signal line 29 and temporarily holds the detection signal after the signal processing. Specifically, the column processing unit 23 performs noise removal processing, analog to digital (AD) conversion processing, and the like, as the signal processing.

The horizontal drive unit 24 includes a shift register, an address decoder, and the like, and sequentially selects unit circuits corresponding to the pixel columns of the column processing unit 23. By selective scanning by the horizontal drive unit 24, the detection signal is sequentially output that is subjected to the signal processing for each unit circuit in the column processing unit 23.

The system control unit 25 includes a timing generator that generates various timing signals, and the like, and performs drive control of the vertical drive unit 22, the column processing unit 23, the horizontal drive unit 24, and the like, on the basis of the various timing signals generated by the timing generator.

The signal processing unit 26 has at least an arithmetic processing function, and performs various types of signal processing such as arithmetic processing, on the basis of the detection signal output from the column processing unit 23. The data storage unit 27 temporarily stores data necessary for the signal processing in the signal processing unit 26.

The light receiving element 1 configured as described above outputs the depth image in which the distance information to the object is stored as the depth value in the pixel value. The light receiving element 1 can be mounted on, for example, a vehicle-mounted system that is mounted on a vehicle and measures a distance to an object outside the vehicle, a gesture recognition device that measures a distance to an object such as a user's hand and recognizes a user's gesture on the basis of the measurement result, and the like.

<2. Equivalent Circuit of Pixel>

Figure 2:
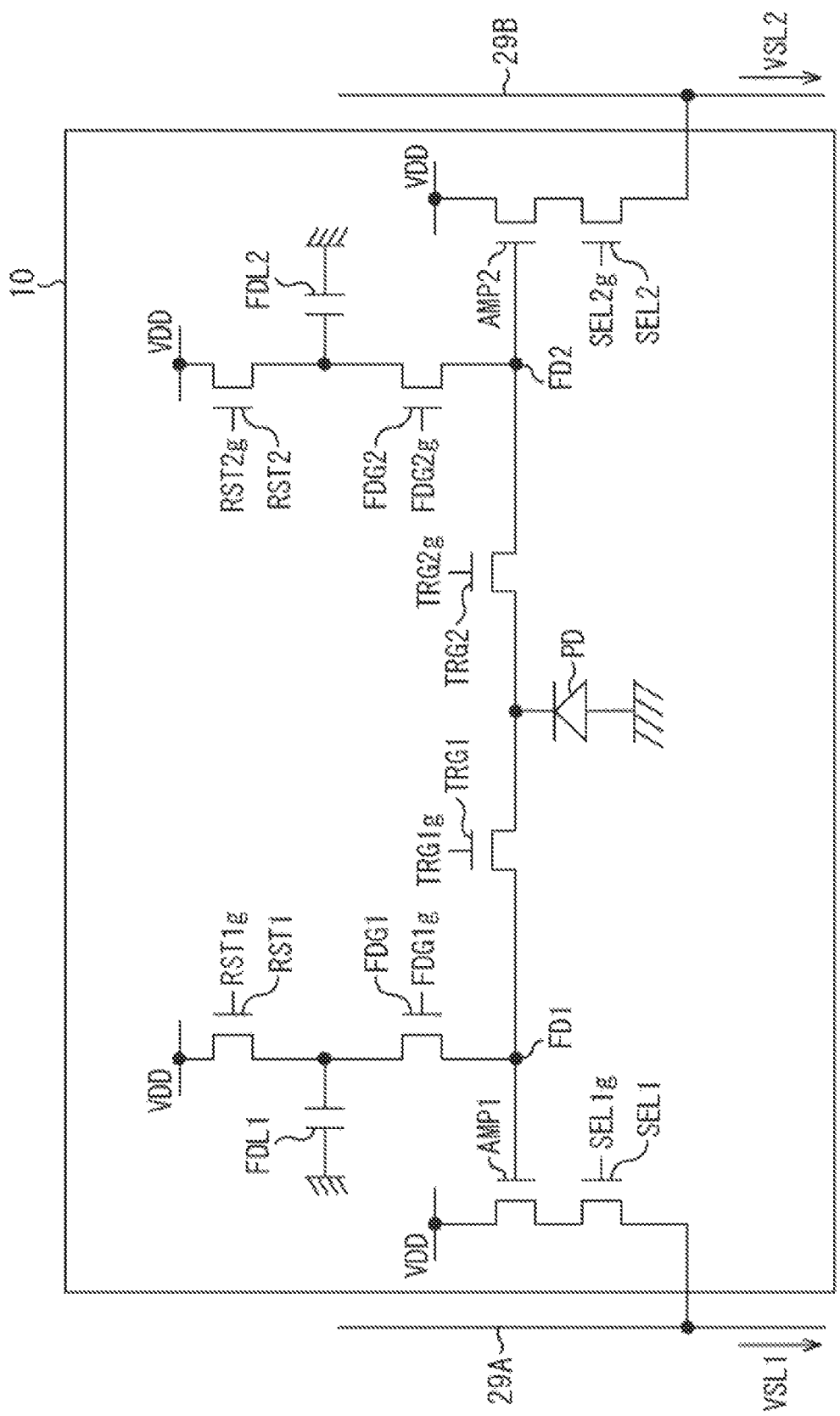
FIG. 2 is a diagram illustrating an equivalent circuit of a pixel.

FIG. 2 illustrates an equivalent circuit of the pixel 10 two-dimensionally arranged in the pixel array unit 21.

The pixel 10 includes a photodiode PD as a photoelectric conversion element. Furthermore, the pixel 10 includes two transfer transistors TRG, two floating diffusion regions FD, two additional capacitances FDL, two switching transistors FDG, two reset transistors RST, two amplification transistors AMP, and two selection transistors SEL.

Here, in the two transfer transistors TRG, the two floating diffusion regions FD, the two additional capacitances FDL, the two switching transistors FDG, the two reset transistors RST, the two amplification transistors AMP, and the two selection transistors SEL that are provided in the pixel 10, in a case where each two are distinguished, they are referred to as transfer transistors TRG1 and TRG2, floating diffusion regions FD1 and FD2, additional capacitances FDL1 and FDL2, switching transistors FDG1 and FDG2, reset transistors RST1 and RST2, amplification transistors AMP1 and AMP2, and selection transistors SEL1 and SEL2, as illustrated in FIG. 2.

The transfer transistors TRG, switching transistors FDG, reset transistors RST, amplification transistors AMP, and selection transistors SEL each includes, for example, an N-type MOS transistor.

When a transfer drive signal TRG1$g$ supplied to the gate electrode of the transfer transistor TRG1 is in an active state, the transfer transistor TRG1 is in a conductive state in response to the transfer drive signal TRG1$g$, thereby transferring an electric charge stored in the photodiode PD to the floating diffusion region FD1. When a transfer drive signal TRG2$g$ supplied to the gate electrode of the transfer transistor TRG2 is in an active state, the transfer transistor TRG2 is in a conductive state in response to the transfer drive signal TRG2$g$, thereby transferring the electric charge stored in the photodiode PD to the floating diffusion region FD2.

The floating diffusion regions FD1 and FD2 each are a charge holding unit that temporarily holds the electric charge transferred from the photodiode PD.

When a FD drive signal FDG1$g$ supplied to the gate electrode of the switching transistor FDG1 is in an active state, the switching transistor FDG1 is in a conductive state in response to the FD drive signal FDG1$g$, thereby connecting the additional capacitance FDL1 to the floating diffusion region FD1. When a FD drive signal FDG2$g$ supplied to the gate electrode of the switching transistor FDG2 is in an active state, the switching transistor FDG2 is in a conductive state in response to the FD drive signal FDG2$g$, thereby connecting the additional capacitance FDL2 to the floating diffusion region FD2.

For example, in a case of high illuminance in which an amount of incident light is high, the vertical drive unit 22 causes the switching transistors FDG1 and FDG2 to be in the active states, connects the floating diffusion region FD1 to the additional capacitance FDL1, and connects the floating diffusion region FD2 to the additional capacitance FDL2. As a result, more electric charge can be stored in the case of the high illuminance.

On the other hand, in a case of low illuminance in which the amount of the incident light is low, the vertical drive unit 22 causes the switching transistors FDG1 and FDG2 to be in inactive states, and disconnects the additional capacitances FDL1 and FDL2 from the floating diffusion regions FD1 and FD2, respectively. As a result, conversion efficiency can be increased.

When a reset drive signal RST1$g$ supplied to the gate electrode of the reset transistor RST1 is in an active state, the reset transistor RST1 is in a conductive state in response to the reset drive signal RST1$g$, thereby resetting a potential of the floating diffusion region FD1 to a predetermined level (power supply voltage VDD). When a reset drive signal RST2$g$ supplied to the gate electrode of the reset transistor RST2 is in an active state, the reset transistor RST2 is in a conductive state in response to the reset drive signal RST2$g$, thereby resetting a potential of the floating diffusion region FD2 to the predetermined level (power supply voltage VDD). Note that, when the reset transistors RST1 and RST2 are caused to be in the active states, the switching transistors FDG1 and FDG2 are also caused to be in the active states at the same time.

The source electrode of the amplification transistor AMP1 is connected to a vertical signal line 29A via the selection transistor SEL1, whereby the amplification transistor AMP1 is connected to a constant current source (not illustrated) to form a source follower circuit. The source electrode of the amplification transistor AMP2 is connected to a vertical signal line 29B via the selection transistor SEL2, whereby the amplification transistor AMP2 is connected to a constant current source (not illustrated) to form a source follower circuit.

The selection transistor SEL1 is connected between the source electrode of the amplification transistor AMP1 and the vertical signal line 29A. When a selection signal SEL1$g$ supplied to the gate electrode of the selection transistor SEL1 is in an active state, the selection transistor SEL1 is in a conductive state in response to the selection signal SEL1$g$, and outputs a detection signal VSL1 output from the amplification transistor AMP1 to the vertical signal line 29A.

The selection transistor SEL2 is connected between the source electrode of the amplification transistor AMP2 and the vertical signal line 29B. When a selection signal SEL2$g$ supplied to the gate electrode of the selection transistor SEL2 is in an active state, the selection transistor SEL2 is in a conductive state in response to the selection signal SEL2g, and outputs a detection signal VSL2 output from the amplification transistor AMP2 to the vertical signal line 29B.

The transfer transistors TRG1 and TRG2, the switching transistors FDG1 and FDG2, the reset transistors RST1 and RST2, the amplification transistors AMP1 and AMP2, and the selection transistors SEL1 and SEL2 of the pixel 10 are controlled by the vertical drive unit 22.

In the equivalent circuit of FIG. 2, the additional capacitances FDL1 and FDL2, and the switching transistors FDG1 and FDG2 that control their connections may be omitted, but by providing the additional capacitances FDL and using them properly depending on the amount of the incident light, a high dynamic range can be secured.

The operation of the pixel 10 will be briefly described.

First, before starting light reception, reset operation for resetting the electric charge of the pixel 10 is performed on all the pixels. In other words, the reset transistors RST1 and RST1, the switching transistors FDG1 and FDG2, and the transfer transistors TRG1 and TRG2 are turned on, and stored electric charges of the photodiode PD, the floating diffusion regions FD1 and FD2, and the additional capacitances FDL1 and FDL2 are discharged to a constant voltage source VDD and the electric charge is reset.

After the stored electric charges are discharged, light reception is started in all the pixels.

During a light receiving period, the transfer transistors TRG1 and TRG2 are alternately driven. In other words, in a first period, the transfer transistor TRG1 is controlled to be turned on and the transfer transistor TRG2 is controlled to be turned off. In the first period, the electric charge generated by the photodiode PD is transferred to the floating diffusion region FD1. In a second period following the first period, the transfer transistor TRG1 is controlled to be turned off and the transfer transistor TRG2 is controlled to be turned on. In the second period, the electric charge generated by the photodiode PD is transferred to the floating diffusion region FD2. As a result, the electric charge generated by the photodiode PD is distributed to the floating diffusion regions FD1 and FD2 and stored.

Then, when the light receiving period ends, each pixel 10 of the pixel array unit 21 is selected in line order. In the selected pixel 10, the selection transistors SEL1 and SEL2 are turned on. As a result, the electric charge stored in the floating diffusion region FD1 is output as the detection signal VSL1 to the column processing unit 23 via the vertical signal line 29A. The electric charge stored in the floating diffusion region FD2 is output as the detection signal VSL2 to the column processing unit 23 via the vertical signal line 29B.

With the above, one light receiving operation ends, and the next light receiving operation starting from the reset operation is executed.

The reflected light received by the pixel 10 is delayed from the timing of irradiation by the light source depending on a distance to the object. Since a distribution ratio between the electric charges stored in the two diffusion regions FD1 and FD2 changes depending on the delay time depending on the distance to the object, the distance to the object can be obtained from the distribution ratio between the electric charges stored in the two diffusion regions FD1 and FD2.

<3. Plan View of Pixel>

Figure 3:
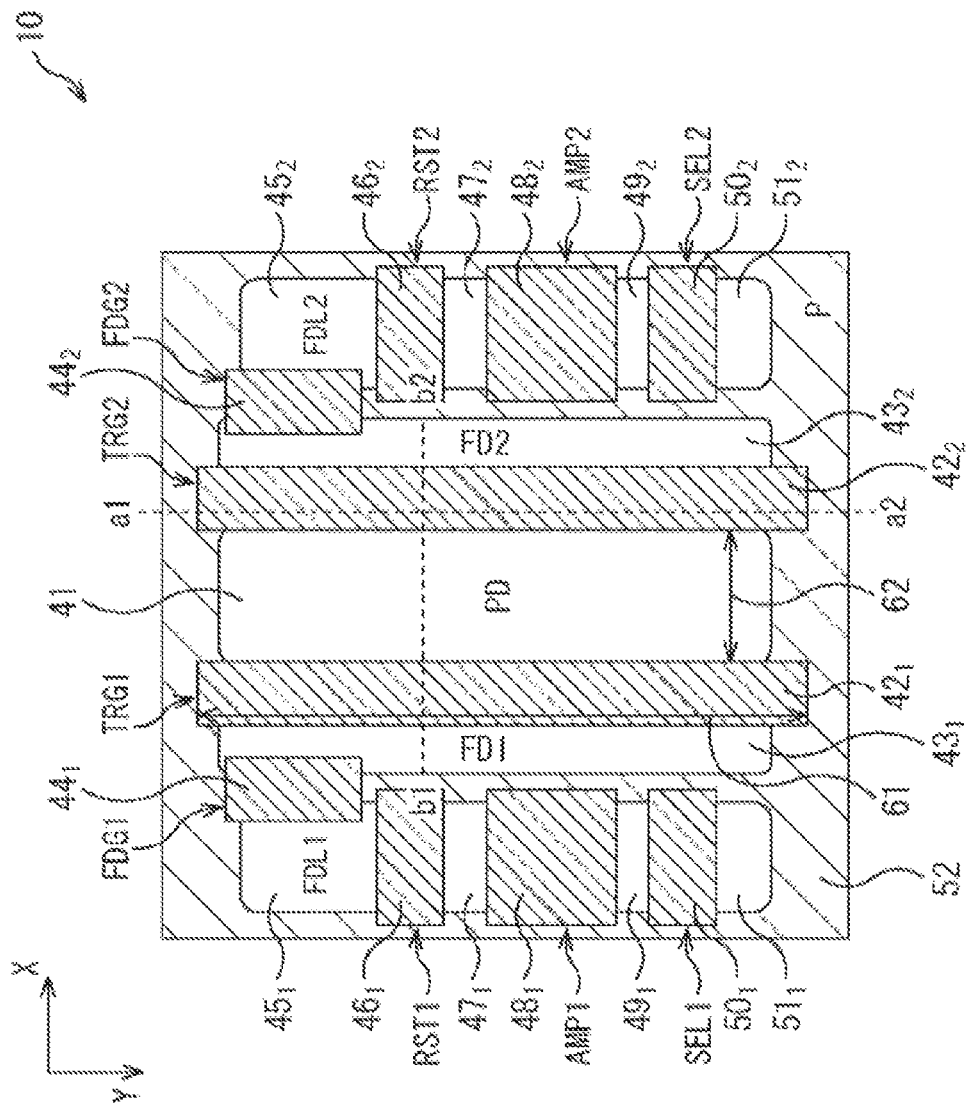
FIG. 3 is a plan view of the pixel.

FIG. 3 is a plan view of the pixel 10 illustrating arrangement of the pixel circuit illustrated in FIG. 2.

The X direction in FIG. 3 corresponds to the row direction (horizontal direction) in FIG. 1, and the Y direction corresponds to the column direction (vertical direction) in FIG. 1.

As illustrated in FIG. 3, in a central region of the rectangular pixel 10, the photodiode PD includes an N-type semiconductor region 41, and the transfer transistors TRG1 and TRG2 are arranged to face the photodiode PD in the X direction.

Moreover, with an intermediate line (not illustrated) between the transfer transistors TRG1 and TRG2 arranged to face each other as a reference, the floating diffusion region FD1, the switching transistor FDG1, the additional capacitance FDL1, the reset transistor RST1, the amplification transistor AMP1, and the selection transistor SEL1 are arranged mirror-symmetrically with respect to the floating diffusion region FD2, the switching transistor FDG2, the additional capacitance FDL2, the reset transistor RST2, the amplification transistor AMP2, and the selection transistor SEL2.

The transfer transistor TRG1 includes a gate electrode $42_1$, an N-type semiconductor region 41 as a source region, and an N-type semiconductor region $43_1$ as a drain region. The N-type semiconductor region 41 as the source region is also used as the photodiode PD, and the N-type semiconductor region $43_1$ as the drain region is also used as the floating diffusion region FD1.

The switching transistor FDG1 includes a gate electrode $44_1$, the N-type semiconductor region $43_1$ as a source region, and an N-type semiconductor region $45_1$ as a drain region. The N-type semiconductor region $43_1$ as the source region is also used as the floating diffusion region FD1, and the N-type semiconductor region $45_1$ as the drain region is also used as the additional capacitance FDL1.

The reset transistor RST1 includes a gate electrode $46_1$, the N-type semiconductor region $45_1$ as a source region, and an N-type semiconductor region $47_1$ as a drain region.

The amplification transistor AMP1 includes a gate electrode $48_1$, the N-type semiconductor region $47_1$ as the drain region, and an N-type semiconductor region $49_1$ as a source region. The N-type semiconductor region $47_1$ as the drain region is also used as the drain region of the reset transistor RST1.

The selection transistor SEL1 includes a gate electrode $50_1$, the N-type semiconductor region $49_1$ as a drain region, and an N-type semiconductor region $51_1$ as a source region. The N-type semiconductor region $49_1$ as the drain region is also used as the source region of the amplification transistor AMP1.

The reset transistor RST1, the amplification transistor AMP1, and the selection transistor SEL1 are arranged side by side in the Y direction in that order, and the transfer transistor TRG1 and the switching transistor FDG1 are arranged side by side in the X direction.

The gate electrode, drain region, and source region of the transfer transistor TRG2, switching transistor FDG2, reset transistor RST2, amplification transistor AMP2, and selection transistor SEL2 each are indicated by a subscript 2, and in the pixel, the only difference is that they are arranged mirror-symmetrically in the X direction with respect to the transfer transistor TRG1, the switching transistor FDG1, the reset transistor RST1, the amplification transistor AMP1, and the selection transistor SEL1, so the descriptions thereof will be omitted. Note that, regarding the transfer transistors TRG, in a case where it is not necessary to distinguish the gate electrodes, drain regions, and source regions of the transfer transistors TRG1 and TRG2, the subscripts are omitted.

The outside of the N-type semiconductor region forming the drain region and the source region of each pixel transistor in the pixel 10 includes a P-type semiconductor region 52.

The photodiode PD and the floating diffusion regions FD1 and FD2 each include a rectangular region longer in the Y direction than in the X direction. The gate electrodes $42_1$ and $42_2$ of the transfer transistors TRG1 and TRG2 are formed longer than the photodiode PD and the floating diffusion regions FD1 and FD2 in the Y direction that is a longitudinal direction. In other words, a gate width 61 of the gate electrodes $42_1$ and $42_2$ of the transfer transistors TRG1 and TRG2 is greater than a region width in the Y direction of the photodiode PD and the floating diffusion regions FD1 and FD2.

Furthermore, a distance 62 between the gate electrodes $42_1$ and $42_2$ of the transfer transistors TRG1 and TRG2 is shorter than the gate width 61 of the gate electrodes $42_1$ and $42_2$ of the transfer transistors TRG1 and TRG2. By making the distance 62 between the gate electrodes 42 of the two transfer transistors TRG shorter than the gate width 61 of the transfer transistors TRG, an electric field in the charge transfer direction is easily applied.

<4. Cross-Sectional View of Pixel>

Figure 4:
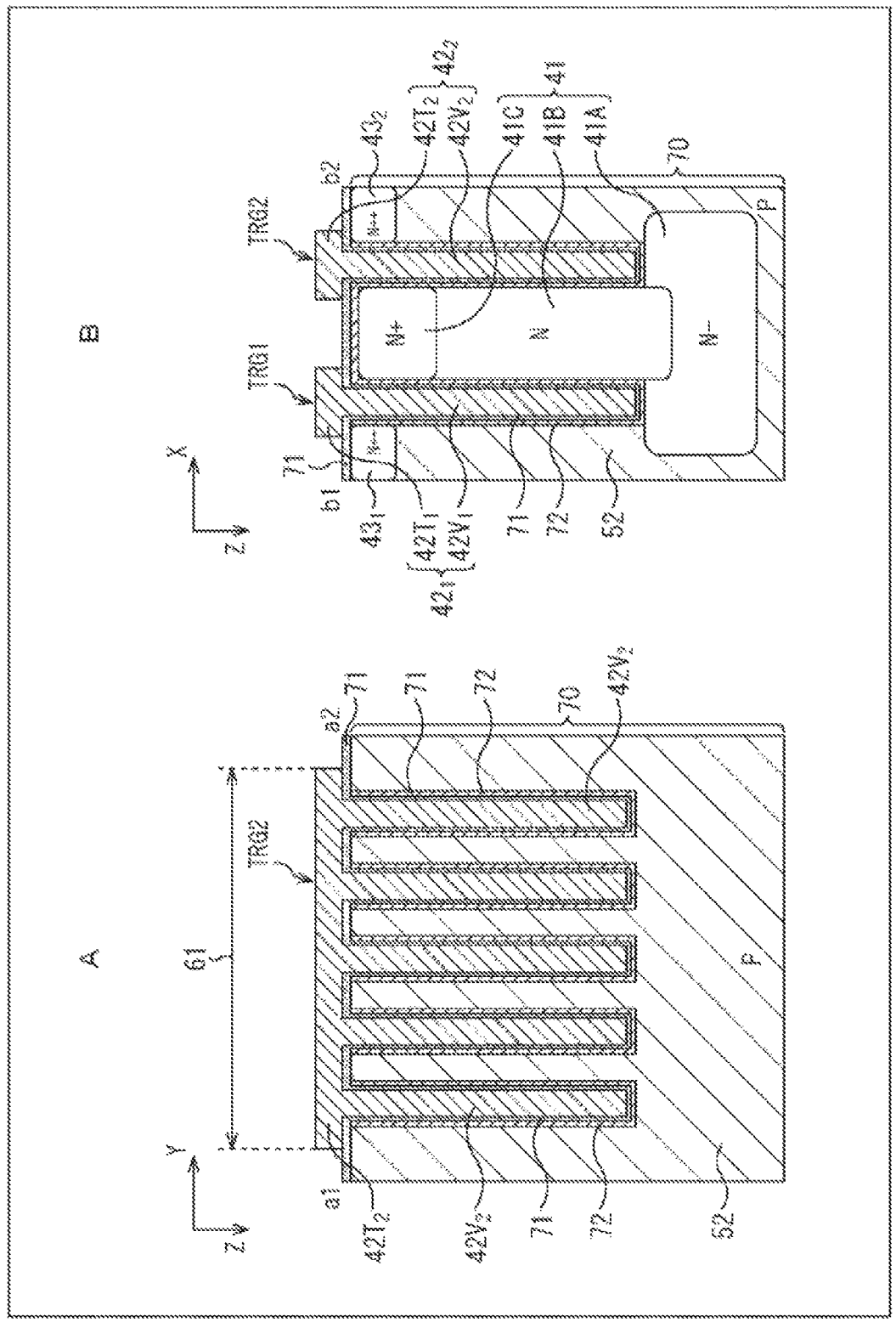
FIG. 4 is a cross-sectional view of the pixel.

FIG. 4 illustrates a cross-sectional view of the pixel 10. A of FIG. 4 is a cross-sectional view of the pixel 10 on a line a1-a2 of FIG. 3, and B of FIG. 4 is a cross-sectional view of the pixel 10 on a line b1-b2 of FIG. 3. The longitudinal direction indicated by the Z axis in FIG. 4 corresponds to a substrate depth direction.

As illustrated in B of FIG. 4, the transfer transistors TRG1 and TRG2 each include a vertical transistor including the gate electrode 42 extending in the substrate depth direction. More specifically, the gate electrode $42_1$ of the transfer transistor TRG1 includes a planar gate electrode portion $42T_1$ formed on the upper surface of a semiconductor substrate 70 including the P-type semiconductor region 52, and a vertical gate electrode portion $42V_1$ extending in the substrate depth direction. A gate electrode $42_2$ of the transfer transistor TRG2 also includes a planar gate electrode portion $42T_2$ formed on the upper surface of the semiconductor substrate 70 including the P-type semiconductor region 52, and a vertical gate electrode portion $42V_2$ extending in the substrate depth direction.

In FIG. 4, the upper surface of the semiconductor substrate 70 on which the transfer transistors TRG1 and TRG2 are formed is the front surface side of the semiconductor substrate 70, and a gate insulating film 71 is formed at a substrate interface. Furthermore, on the front surface side of the semiconductor substrate 70, a multilayer wiring layer is formed described later with reference to FIG. 12.

The gate insulating film 71 and a P-type semiconductor region 72 are formed between the P-type semiconductor region 52 and the vertical gate electrode portion 42V. An impurity concentration in the P-type semiconductor region 72 is set as a higher concentration than an impurity concentration in the P-type semiconductor region 52, and the P-type semiconductor region 72 functions as a pinning region that suppresses generation of a dark current.

The back surface side of the semiconductor substrate 70, which is the lower side in B of FIG. 4, is an incident surface on which the reflected light is incident, and an on-chip lens and the like (not illustrated) are formed.

The N-type semiconductor region 41 constituting the photodiode PD includes an N-type semiconductor region 41A on the lower side (back surface side of the semiconductor substrate) than the vertical gate electrode portion 42V of the transfer transistor TRG, and an N-type semiconductor region 41B and an N-type semiconductor region 41C formed between the vertical gate electrode portions 42 of the two transfer transistors TRG. Impurity concentrations in the N-type semiconductor region 41A to N-type semiconductor region 41C increase in the order of the N-type semiconductor region 41A, the N-type semiconductor region 41B, and the N-type semiconductor region 41C. Note that, in the drawings, an impurity concentration in the N-type semiconductor region is described such as "N++", "N+", "N", or "N−", and it represents that the impurity concentration of "N++" is the highest, and the impurity concentration decreases in the order of "N++", "N+", "N", and "N−".

The vertical transfer transistor TRG can be formed by forming a trench (vertical hole) from the front surface side of the substrate by dry etching, and forming the gate insulating film 71, and then embedding polysilicon or the like serving as a gate electrode.

With the gate electrode 42 of the vertical transfer transistor TRG as the center, the N-type semiconductor regions $43_1$ and $43_2$ as the floating diffusion regions FD1 and FD2 are formed on opposite sides from the N-type semiconductor region 41 side constituting the photodiode PD.

As illustrated in A of FIG. 4, the transfer transistor TRG includes a plurality of the vertical gate electrode portions 42V at predetermined intervals to have a comb-teeth shape in a cross-sectional view in the Y direction that is a direction of the gate width 61. The gate insulating film 71 and the P-type semiconductor region 72 are formed on an outer peripheral portion of the plurality of vertical gate electrode portions 42V of the transfer transistor TRG, and a region between the P-type semiconductor regions 72 formed on the outer peripheral portion of the vertical gate electrode portion 42V includes the P-type semiconductor region 52 having a concentration lower than that of the P-type semiconductor region 72.

As described above, the two transfer transistors TRG1 and TRG2 of the pixel 10 each include the vertical transistor including the plurality of vertical gate electrode portions 42V in the gate width direction.

<5. Effect of Vertical Transistor>

Figure 5:
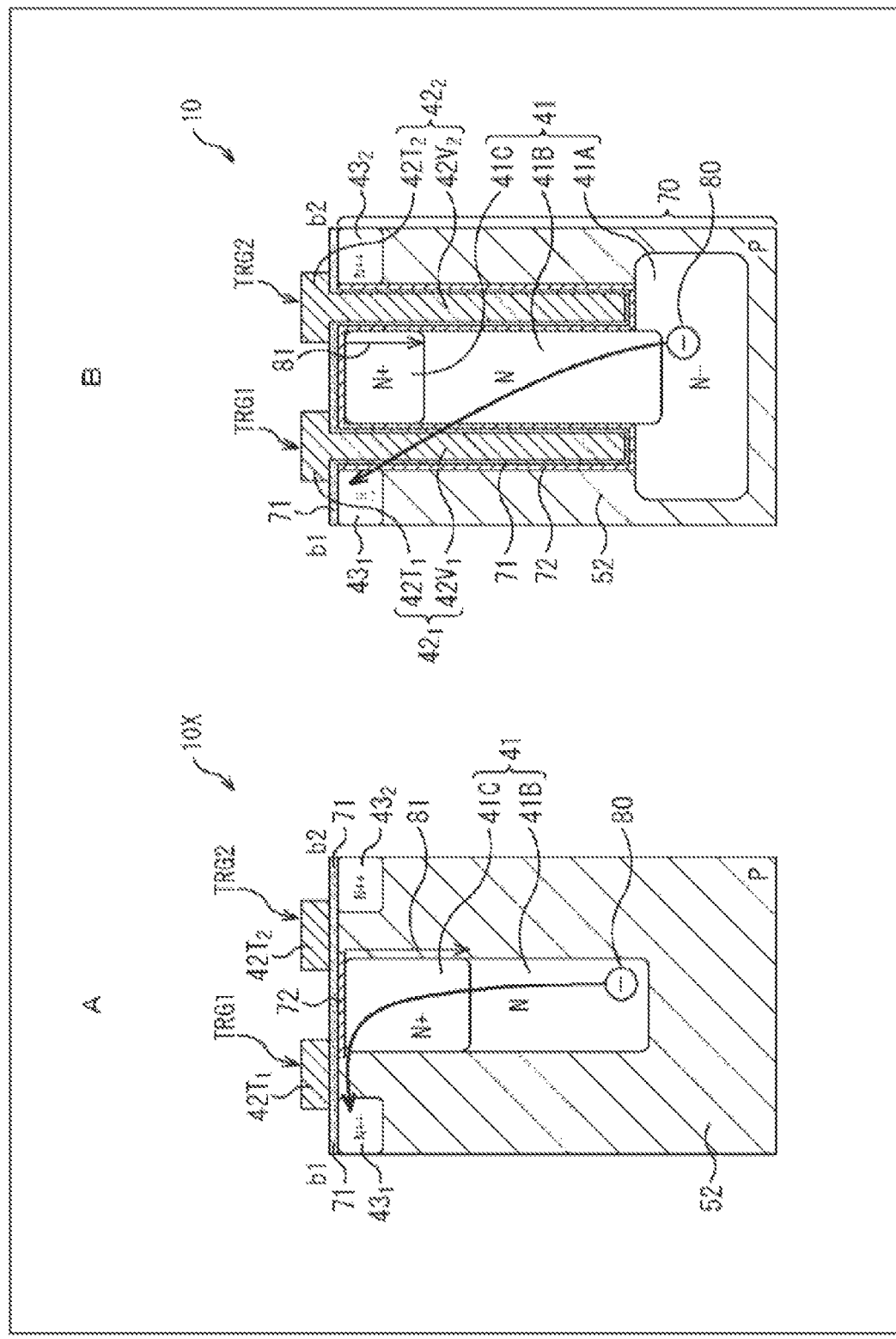
FIG. 5 is a diagram explaining an effect of the pixel to which the present technology is applied.

Next, with reference to FIG. 5, comparison will be made between a case where the two transfer transistors TRG1 and TRG2 of the pixel 10 includes the vertical transistor and a case where the two transfer transistors TRG1 and TRG2 includes a normal planar transistor.

A of FIG. 5 illustrates a b1-b2 line sectional view of a pixel 10X in a case where the transfer transistors TRG1 and TRG2 each include the normal planar transistor.

B of FIG. 5 is a b1-b2 line sectional view of the pixel 10 similar to B of FIG. 4.

Note that, to facilitate the comparison, even in the pixel 10X of A of FIG. 5, the same reference numerals as those of the pixel 10 are given to portions corresponding to those of the pixel 10.

For example, a state is considered where the transfer transistor TRG1 is controlled to be turned on, and an electron (electric charge) 80 generated in the N-type semiconductor region 41 constituting the photodiode PD is transferred to the N-type semiconductor region $43_1$ as the floating diffusion region FD.

As illustrated in A of FIG. 5, in the pixel 10X in which the two transfer transistors TRG1 and TRG2 each include the planar transistor including only the planar gate electrode portion 42T, the electron 80 generated in the N-type semiconductor region 41 is transferred to the N-type semiconductor region $43_1$ through a channel formed in a portion below the planar gate electrode portion $42T_1$. Since the channel between the N-type semiconductor region 41 and the N-type semiconductor region $43_1$ is only the substrate interface below the planar gate electrode portion $42T_1$, a transfer path of the electron 80 is long and a transfer time is also long. For that reason, the N-type semiconductor region 41 of the photodiode PD cannot be formed deep into the substrate. For example, the N-type semiconductor region 41 of the pixel 10 includes only the N-type semiconductor regions 41B and 41C as illustrated in A of FIG. 5, and the N-type semiconductor region 41A closest to the back surface side of the substrate is not formed. Furthermore, to transfer the electron 80 generated at a deep position in the substrate, it is necessary to make a depth 81 of the N-type semiconductor region 41C having a high impurity concentration deeper than the depth 81 of the pixel 10 of B of FIG. 5.

On the other hand, as illustrated in B of FIG. 5, in the pixel 10 in which the two transfer transistors TRG1 and TRG2 each include the vertical transistor including the vertical gate electrode portion 42V, the electron 80 generated in the N-type semiconductor region 41 is transferred to the N-type semiconductor region $43_1$ through a channel formed between the plurality of comb-teeth shape vertical gate electrode portions 42V in addition to the portion below the planar gate electrode portion $42T_1$. In this case, the electron 80 can move linearly to the N-type semiconductor region $43_1$ as illustrated by an arrow in B of FIG. 5, and the transfer path can be shortened. As a result, the transfer time is shortened.

Moreover, the plurality of vertical gate electrode portions 42V is provided, whereby even the electron 80 generated at the deep position in the substrate can be transferred at high speed, so that the N-type semiconductor region 41A can be formed in a region near the back surface side of the substrate, and the depth 81 of the N-type semiconductor region 41C having the high impurity concentration can be made shallower than the depth 81 of the pixel 10X of A of FIG. 5.

Figure 6:
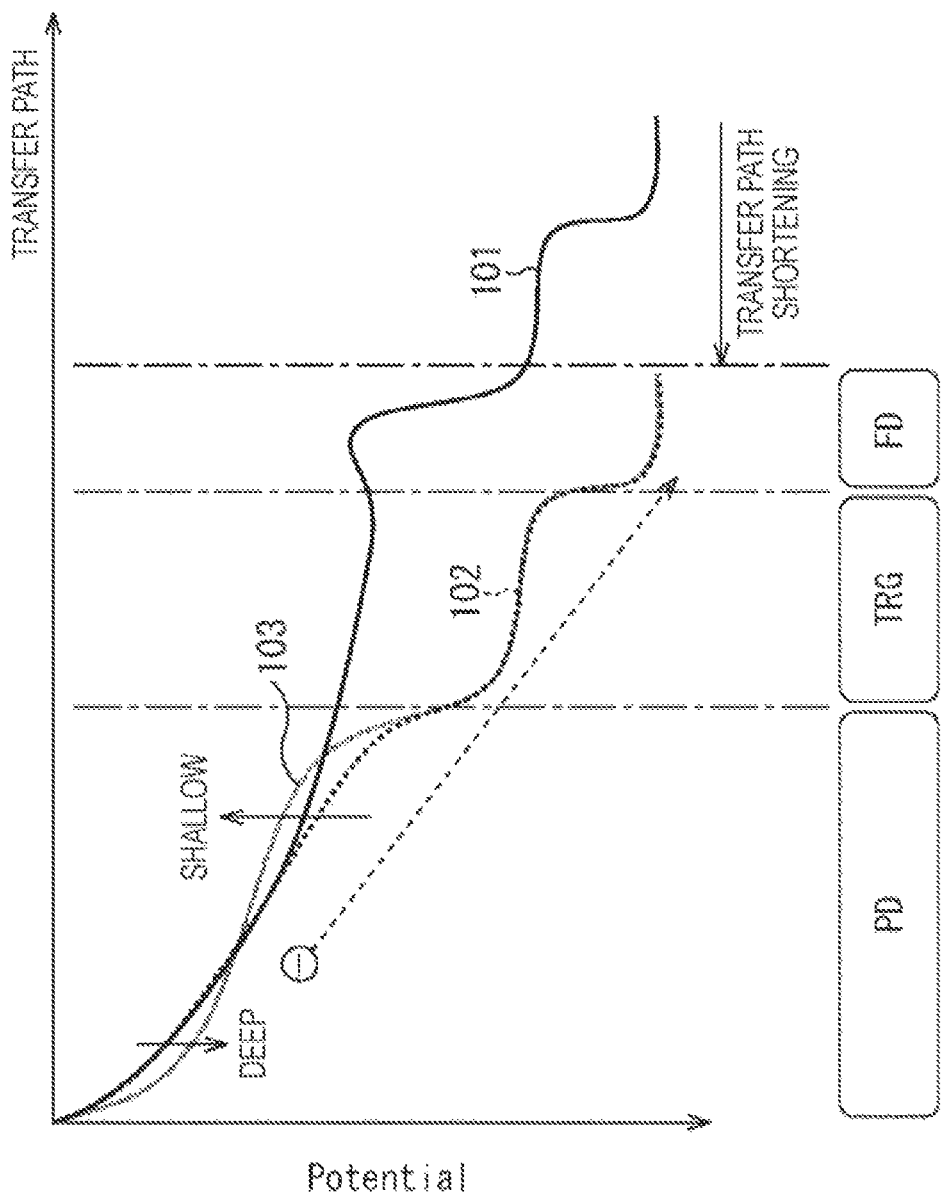
FIG. 6 is a diagram explaining an effect of the pixel to which the present technology is applied.

FIG. 6 is a graph illustrating potentials and transfer paths in a case where the planar transistor of A of FIG. 5 is used as the transfer transistor and in a case where the vertical transistor of B of FIG. 5 is used as the transfer transistor.

The vertical axis of the graph of FIG. 6 represents the potential, and the horizontal axis represents the transfer path of the electron from the photodiode PD to the floating diffusion region FD.

A solid line 101 in the graph of FIG. 6 illustrates a potential gradient of the pixel 10X using the planar transistor of A of FIG. 5.

A broken line 102 in the graph of FIG. 6 illustrates a potential gradient in a case where the transfer transistor of the pixel 10X of A of FIG. 5 is changed from the planar transistor to the same vertical transistor as the transfer transistor TRG. In the broken line 102, the N-type semiconductor region 41 as the photodiode PD is similar to that of the pixel 10X of A of FIG. 5.

A solid line 103 in the graph of FIG. 6 illustrates a potential gradient of the pixel 10 of B of FIG. 5. In other words, the solid line 103 illustrates a potential gradient in a case where the transfer transistor of the pixel 10X of A of FIG. 5 is changed from the planar transistor to the vertical transistor, and in the N-type semiconductor region 41 as the photodiode PD, as illustrated in B of FIG. 5, the depth 81 of the N-type semiconductor region 41C having the high impurity concentration is made shallower, and the N-type semiconductor region 41A is formed in the vicinity of the back surface side of the substrate.

As illustrated in FIG. 6, the transfer path can be shortened by changing the transfer transistor TRG from the planar transistor to the vertical transistor. Furthermore, by making the depth 81 of the N-type semiconductor region 41C having the high impurity concentration shallower and forming the N-type semiconductor region 41A in the vicinity of the back surface side of the substrate, the potential of the deep part of the photodiode PD can be deepened, and the potential in the vicinity of the transfer transistor TRG can be made shallower.

By forming the N-type semiconductor region 41A in the vicinity of the back surface side of the substrate, a photoelectric conversion region can be expanded and a saturated amount of electric charge can be increased.

By making the potential in the vicinity of the transfer transistor TRG shallower, it is possible to further reduce operation in which the signal charge during transfer returns to the photodiode when the gate electrode of the transfer transistor TRG is turned off, that is, signal degradation due to so-called signal return.

Figure 7:
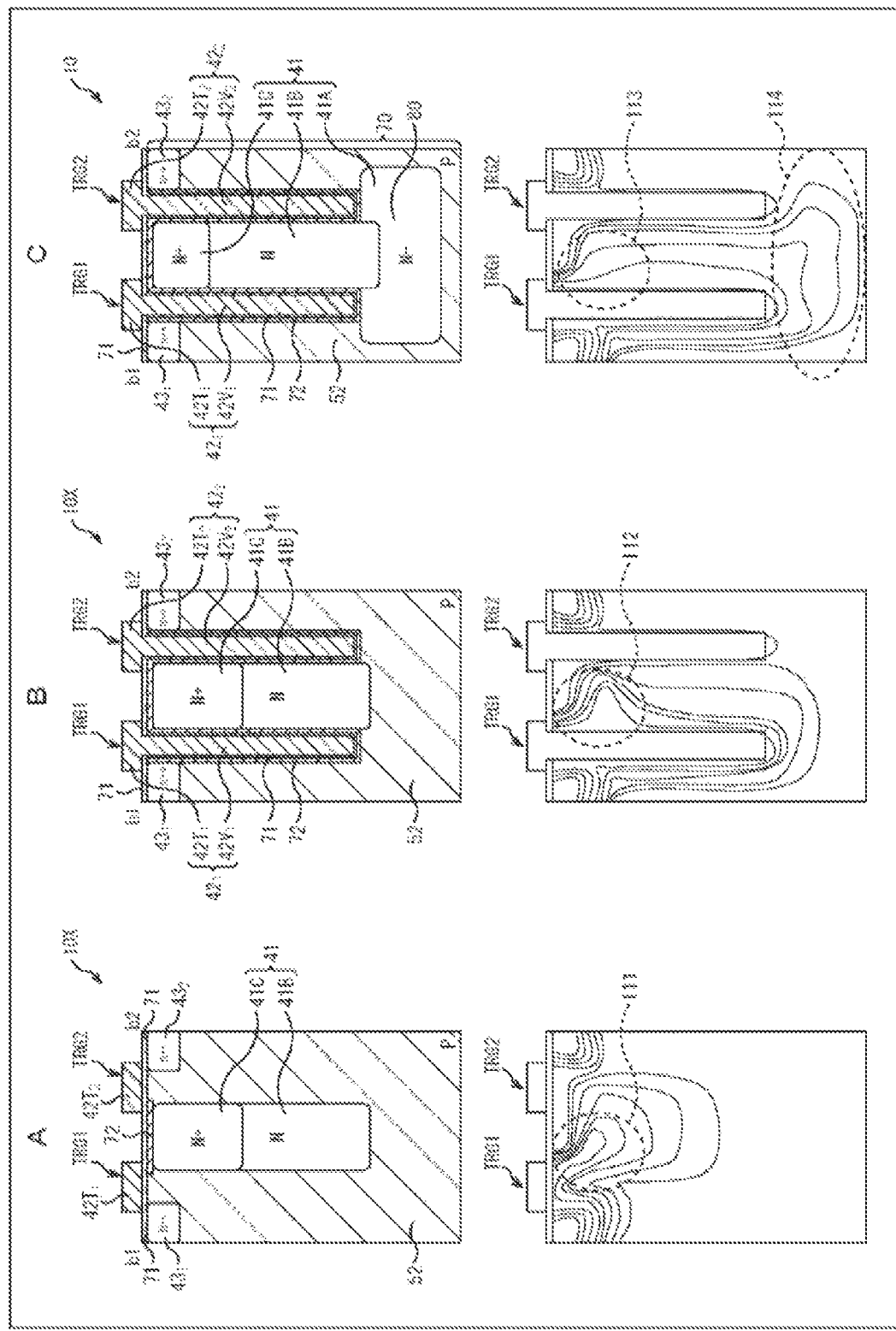
FIG. 7 is a diagram explaining an effect of the pixel to which the present technology is applied.

FIG. 7 illustrates potential distributions corresponding to the solid line 101, the broken line 102, and the solid line 103 in FIG. 6.

A of FIG. 7 illustrates a b1-b2 line sectional view (upper row) and a potential distribution (lower row) of the pixel 10X using the planar transistor as the transfer transistor. A of FIG. 7 corresponds to the solid line 101 in FIG. 6.

B of FIG. 7 illustrates a b1-b2 line sectional view (upper row) and a potential distribution (lower row) of the pixel 10X using the vertical transistor as the transfer transistor. B of FIG. 7 corresponds to the broken line 102 in FIG. 6.

C of FIG. 7 illustrates a b1-b2 line sectional view (upper row) and a potential distribution (lower row) of the pixel 10 of the light receiving element 1. C of FIG. 7 corresponds to the solid line 103 in FIG. 6.

Note that, the potential distributions of A to C of FIG. 7 all illustrate the potential distribution in a state where the transfer transistor TRG1 is controlled to be turned on. Furthermore, also in the pixels 10X of A and B of FIG. 7, the same reference numerals as those of the pixel 10 are given to portions corresponding to those of the pixel 10, similarly to FIG. 5.

As is clear by comparing the potential distributions of regions 111 to 113 near the substrate front surface side interface of the transfer transistor TRG1 in each of A to C of FIG. 7, the potential in the vicinity of the transfer transistor TRG1 is deep (high) in A and B of FIG. 7, whereas the potential in the vicinity of the transfer transistor TRG1 is shallow (low) in C of FIG. 7. With this potential structure, a sensor can be achieved that is resistant to transfer degradation due to signal return.

Furthermore, in the pixel 10 of C of FIG. 7, the N-type semiconductor region 41A is formed in the region near the back surface side of the substrate, so that a depletion layer is expanded to the vicinity of the back surface side of the substrate as illustrated in the region 114, as compared to those in the pixels 10X of A and B of FIG. 7. With this potential structure, high sensitivity can be achieved.

<6. Planar Shape of Vertical Gate Electrode Portion>

Figure 8:
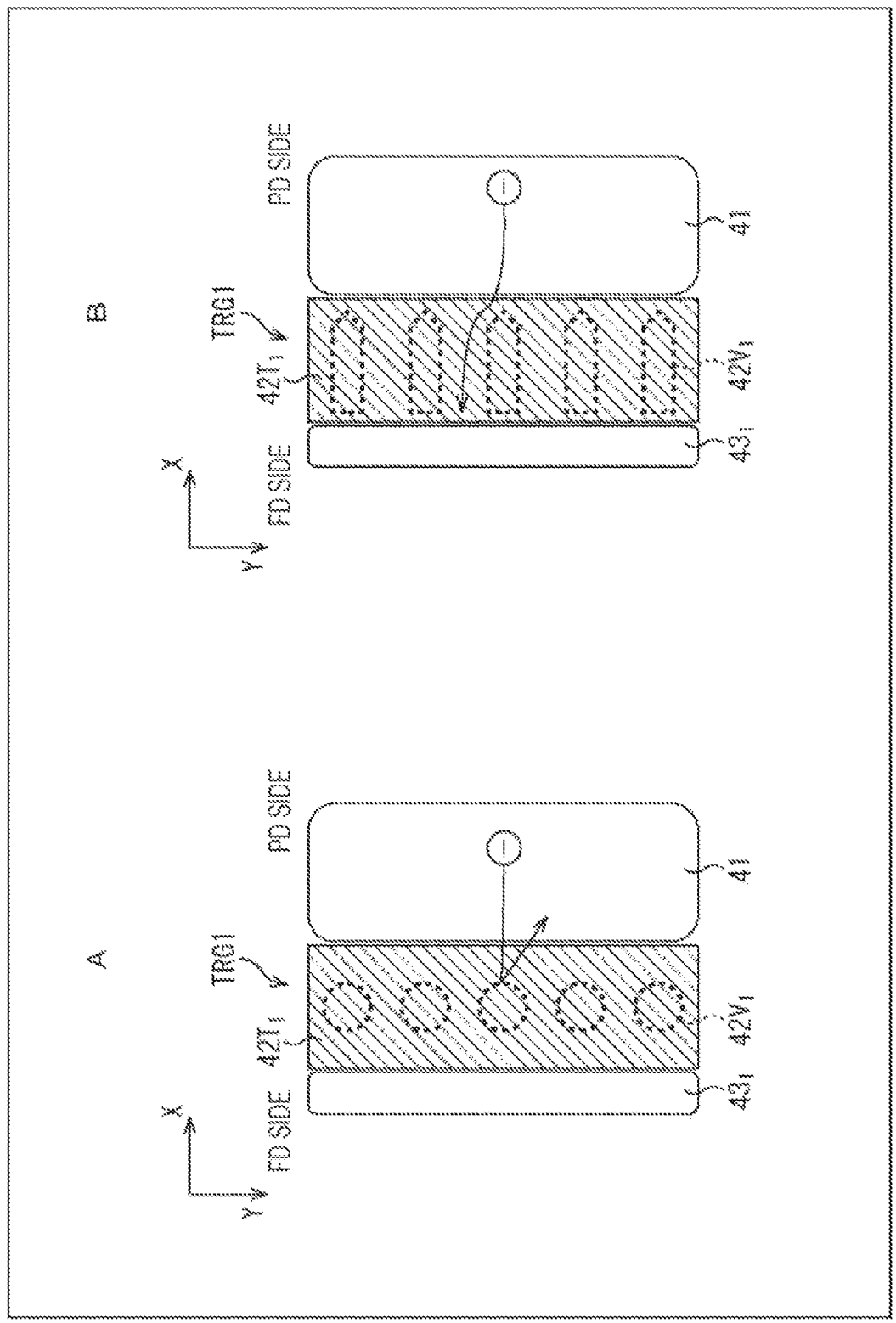
FIG. 8 is a plan view explaining a planar shape of a vertical gate electrode portion.

FIG. 8 is a plan view explaining a planar shape of the vertical gate electrode portion 42V.

The planar shape of the vertical gate electrode portion 42V can be a round shape, for example, as illustrated in A of FIG. 8. However, in a case where the planar shape of the vertical gate electrode portion 42V is a round shape, an area of the vertical gate electrode portion 42V with respect to the XY plane increases, and the electron may collide with the vertical gate electrode portion 42V, which may cause a decrease in the transfer speed.

Thus, the planar shape of the vertical gate electrode portion 42V can be formed in an elongated shape having a width in the direction (X direction) orthogonal to the direction of the gate width 61 longer than a width in the direction of the gate width 61 (Y direction), for example, as illustrated in B of FIG. 8. Furthermore, the planar shape of the vertical gate electrode portion 42V can be formed in the elongated shape convex on the photodiode PD side. As a result, the electron is less likely to collide with the vertical gate electrode portion 42V, and the decrease in the transfer speed can be suppressed.

<7. Arrangement Example of Multiple Pixels>

Figure 9:
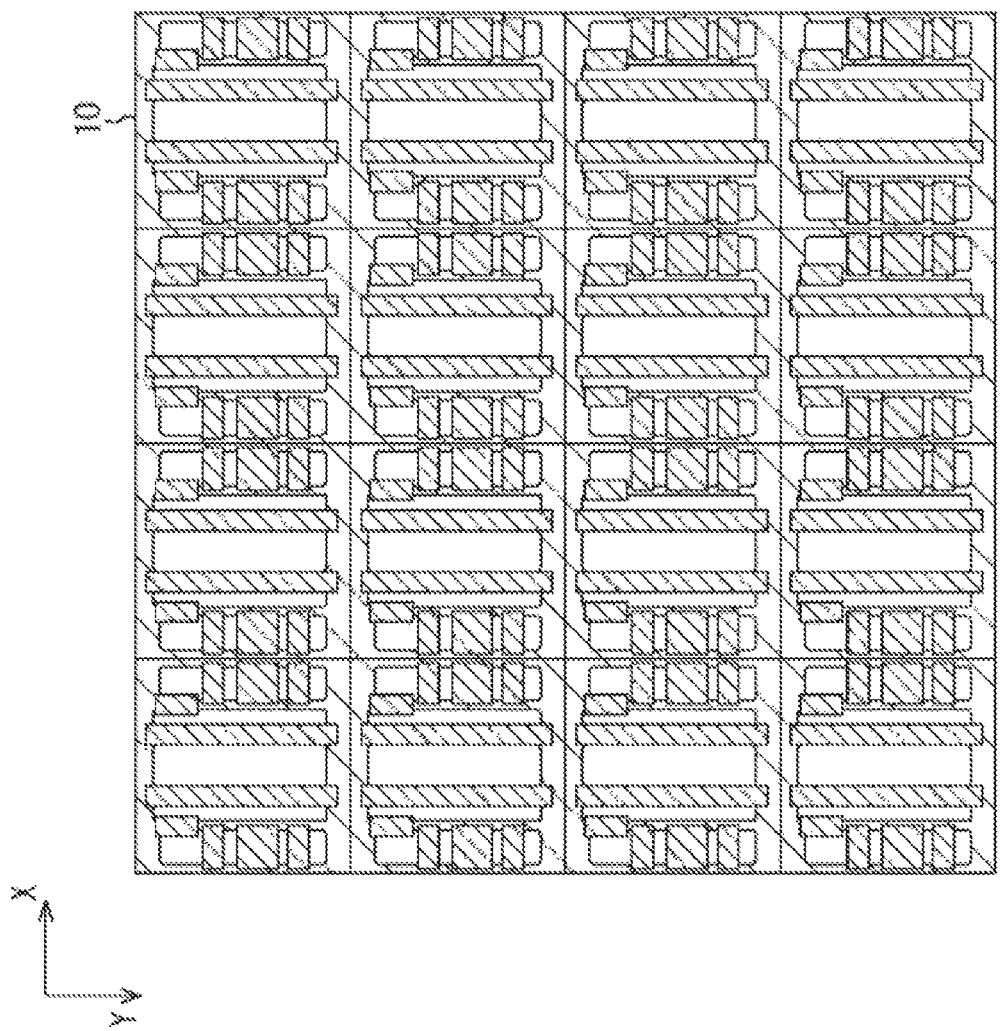
FIG. 9 is a diagram illustrating a pixel arrangement example of a pixel array unit.

FIG. 9 illustrates a pixel arrangement example of the pixel array unit 21.

In the pixel array unit 21, the pixels 10 illustrated in FIG. 3 are two-dimensionally arranged in the row and column directions, as illustrated in FIG. 9. Note that, due to space limitations, FIG. 9 illustrates only an array of 16 (4×4) pixels in which the pixels 10 are arranged so that 4 pixels are arranged in the row direction and 4 pixels are arranged in the column direction, but the number of pixels is not limited to this. In FIG. 9, the reference numerals are also omitted due to space limitations.

<8. Drive of Transfer Transistor>

Next, the drive of the transfer transistor TRG will be described with reference to FIGS. 10 and 11.

Figure 10:
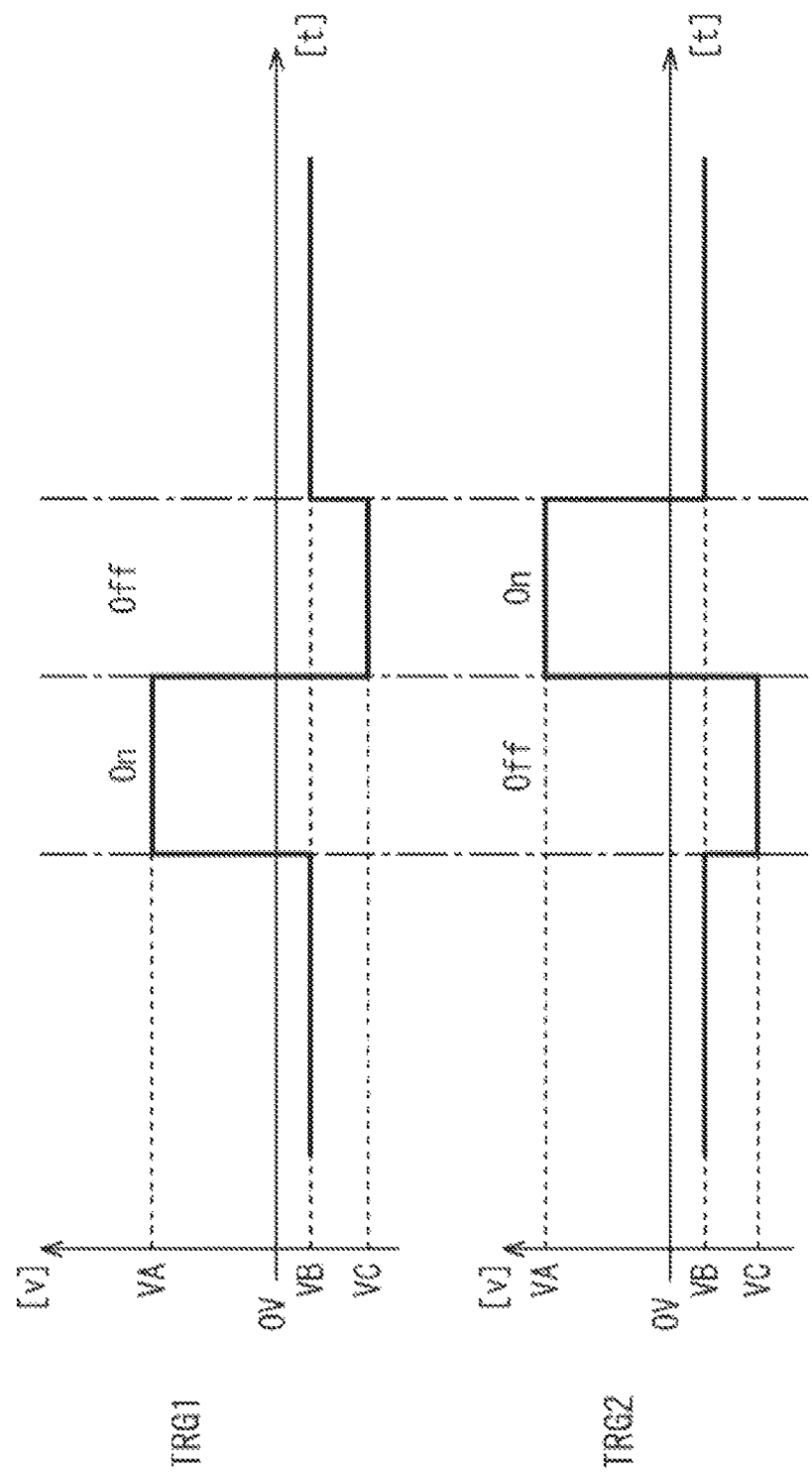
FIG. 10 is a diagram explaining drive of a transfer transistor.

FIG. 10 is a diagram illustrating an applied voltage when the transfer transistor TRG is driven.

As described above, the pixel 10 of the light receiving element 1 distributes the electric charge to the floating diffusion regions FD1 and FD2 by alternately performing control of turning on one of the two transfer transistors TRG1 and TRG2 and turning off the other.

As first drive, to the pixel 10, the vertical drive unit 22 can perform control in which the applied voltage to one transfer transistor TRG (for example, the transfer transistor TRG1) to be turned on is set to a positive predetermined voltage VA, and the applied voltage to the other transfer transistor TRG (for example, the transfer transistor TRG2) to be turned off is set to a negative predetermined voltage VB (first negative bias VB). Here, the first negative bias VB is a negative bias for pinning for suppressing a white spot and a dark current.

Furthermore, as second drive, to the pixel 10, the vertical drive unit 22 can perform control in which the applied voltage to one transfer transistor TRG (for example, the transfer transistor TRG1) to be turned on is set to a positive predetermined voltage VA, and the applied voltage to the other transfer transistor TRG (for example, the transfer transistor TRG2) to be turned off is set to a negative predetermined voltage VC (second negative bias VC), as illustrated in FIG. 10. Here, the second negative bias VC is a negative bias greater than the first negative bias VB for pinning.

Figure 11:
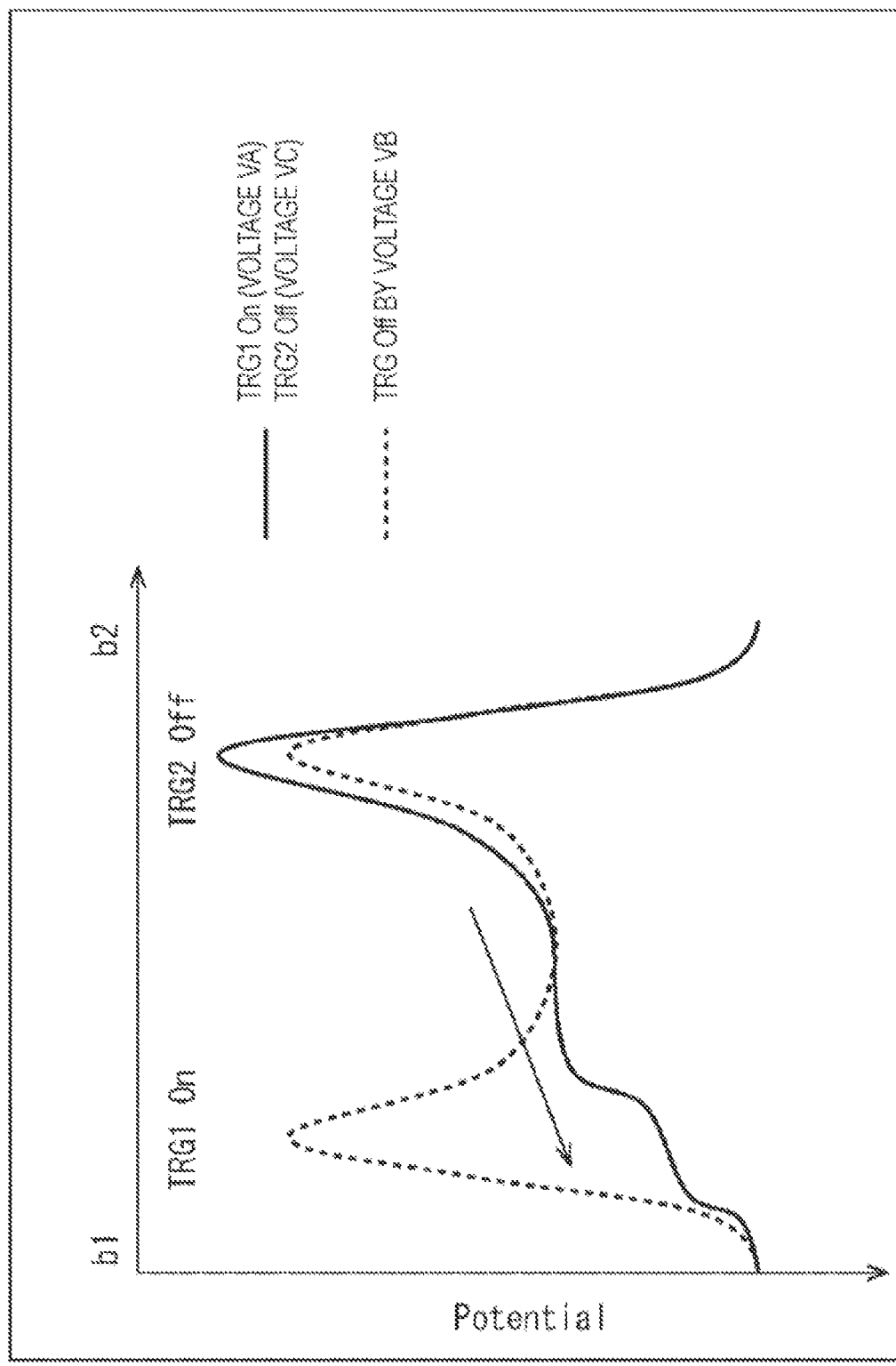
FIG. 11 is a diagram explaining the drive of the transfer transistor.

FIG. 11 illustrates a potential between the two transfer transistors TRG1 and TRG2 in a case where the second drive is performed.

A solid line in the graph of FIG. 11 indicates a potential between the two transfer transistors TRG1 and TRG2 in a case where the second drive is performed, and a broken line indicates a potential in a case where the transfer transistors TRG1 and TRG2 are turned off by the first negative bias VB.

As indicated by the solid line in FIG. 11, the second negative bias VC greater than the first negative bias VB for pinning is applied to the transfer transistor TRG to a side to be turned off, whereby an electric field gradient can be increased and can assist in charge transfer. Thus, transfer characteristics of the electric charge can be improved by the second drive.

<9. Arrangement Example of Wiring Layer>

Figure 12:
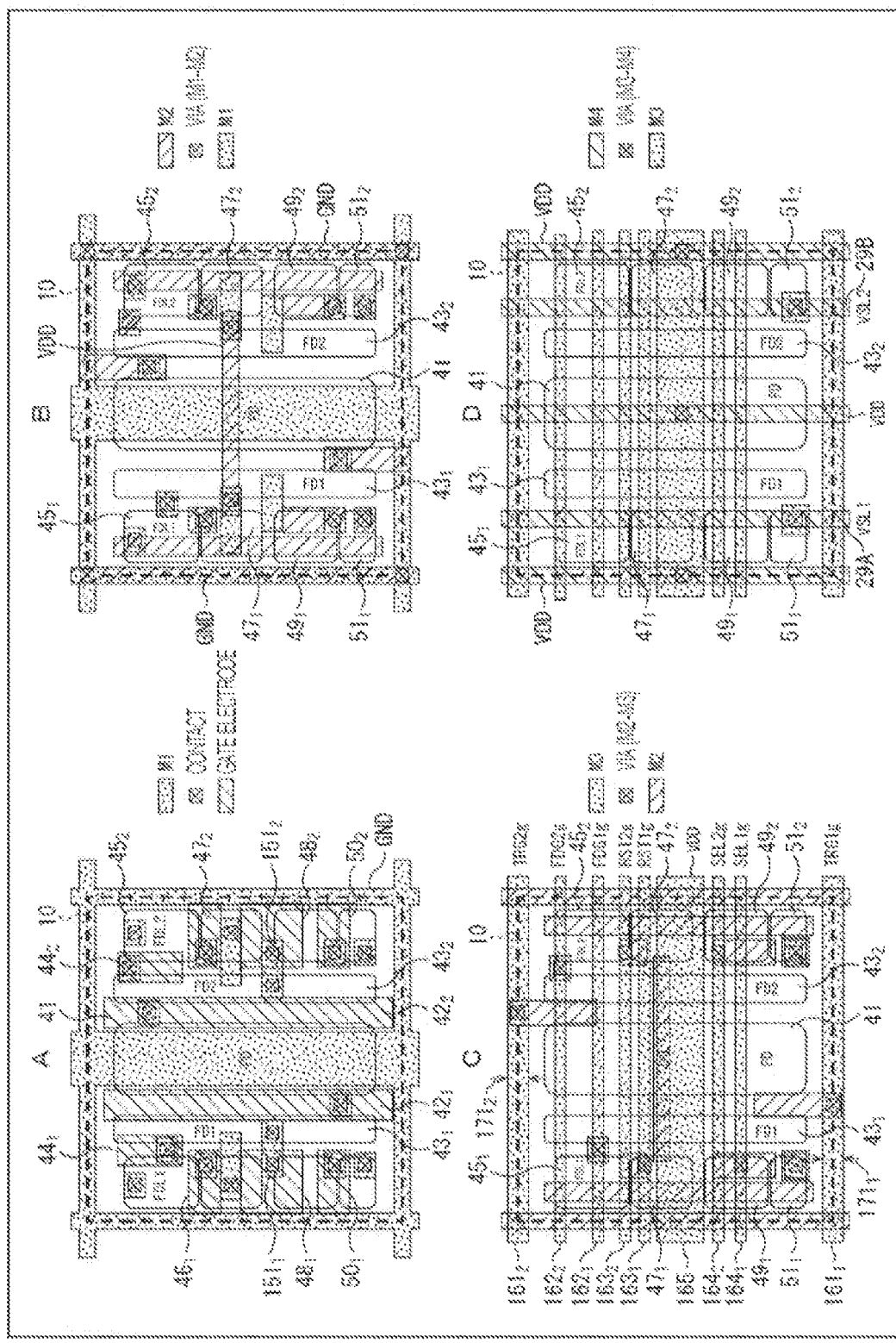
FIG. 12 is a plan view illustrating an arrangement example of a multilayer wiring layer.

FIG. 12 illustrates an arrangement example of the multi-layer wiring layer of the light receiving element 1 formed on the front surface side of the semiconductor substrate 70.

Note that, in FIG. 12, the same reference numerals are given to portions corresponding to those in FIG. 3, but some of the reference numerals are omitted.

The light receiving element 1 includes, for example, a multilayer wiring layer including four wiring layers of a first wiring layer M1 to a fourth wiring layer M4 and an interlayer insulating layer. The four wiring layers are in the order of the first wiring layer M1, the second wiring layer M2, the third wiring layer M3, and the fourth wiring layer M4 in order from a side closest to the semiconductor substrate 70.

A of FIG. 12 is a plan view illustrating arrangement of the gate electrodes and N-type semiconductor regions of the pixel transistors formed on the front surface side of the semiconductor substrate 70, the first wiring layer M1, and contacts between the gate electrodes of the pixel transistors and the first wiring layer M1.

As illustrated in A of FIG. 12, the first wiring layer M1 is formed at least at a boundary portion of the pixel 10 and is connected to GND. Furthermore, the first wiring layer M1 is connected to the gate electrodes of the pixel transistors via the contacts. The N-type semiconductor region $43_1$ that functions as the floating diffusion region FD1 is connected to the gate electrode $48_1$ of the amplification transistor AMP1 via a wiring line $151_1$, and the N-type semiconductor region $43_2$ that functions as the floating diffusion region FD2 is connected to the gate electrode $48_2$ of the amplification transistor AMP2 via a wiring line $151_2$.

B of FIG. 12 is a plan view illustrating arrangement of the first wiring layer M1, the second wiring layer M2, and vias connecting the first wiring layer M1 and the second wiring layer M2 together.

Wiring lines for relaying to the third wiring layer M3 and the fourth wiring layer M4 are arranged in the second wiring layer M2.

C of FIG. 12 is a plan view illustrating arrangement of the second wiring layer M2, the third wiring layer M3, and vias connecting the second wiring layer M2 and the third wiring layer M3 together.

A control line that transmits the pixel array unit 21 in the horizontal direction and a power supply line are arranged in the third wiring layer M3.

Specifically, the third wiring layer M3 is formed with wiring lines $161_1$ and $161_2$ that transmit the transfer drive signals TRG1g and TRG2g supplied to the gate electrodes of the transfer transistors TRG1 and TRG2, wiring lines $162_1$ and $162_2$ that transmit the FD drive signals FDG1g and FDG2g supplied to the gate electrodes of the switching transistors FDG1 and FDG2, wiring lines $163_1$ and $163_2$ that transmit the reset drive signals RST1g and RST2g supplied to the gate electrodes of the reset transistors RST1 and RST2, wiring lines $164_1$ and $164_2$ that transmit the selection signals SEL1g and SEL2g supplied to the gate electrodes of the selection transistors SEL1 and SRL2, and a wiring line 165 that transmits the power supply voltage VDD.

Line widths $171_1$ and $171_2$ of the wiring lines $161_1$ and $161_2$ that transmit the transfer drive signals TRG1g and TRG2g are formed thicker than the wiring lines $162_1$, $162_2$, $163_1$, $163_2$, $164_1$, and $164_2$ of other pixel transistors, to improve settling.

D of FIG. 12 is a plan view illustrating arrangement of the third wiring layer M3, the fourth wiring layer M4, and vias connecting the third wiring layer M3 and the fourth wiring layer M4 together.

The vertical signal lines 29A and 29B for transmitting the pixel array unit 21 in the vertical direction and a power supply line are arranged in the fourth wiring layer M4.

<10. Modification of Pixel>

Figure 13:
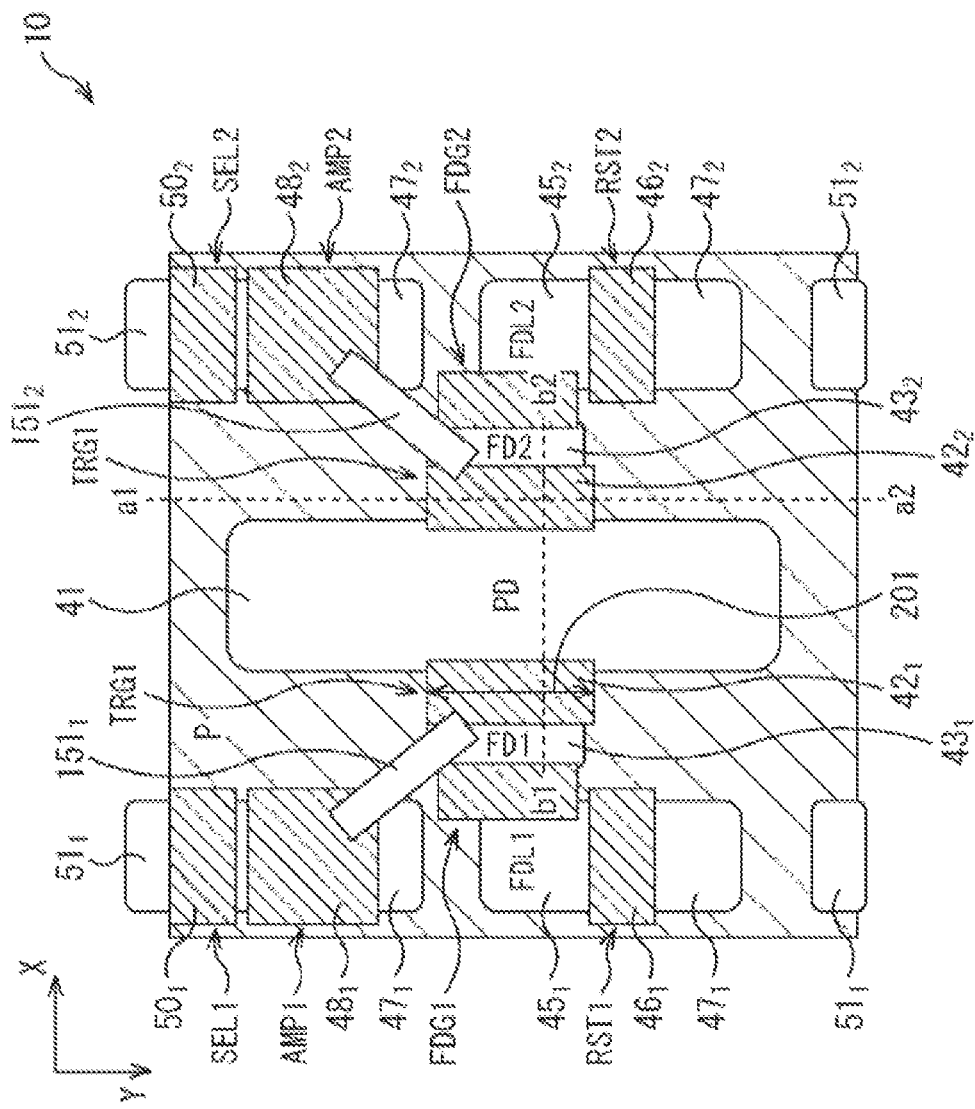
FIG. 13 is a plan view illustrating a modification of the pixel.
Figure 14:
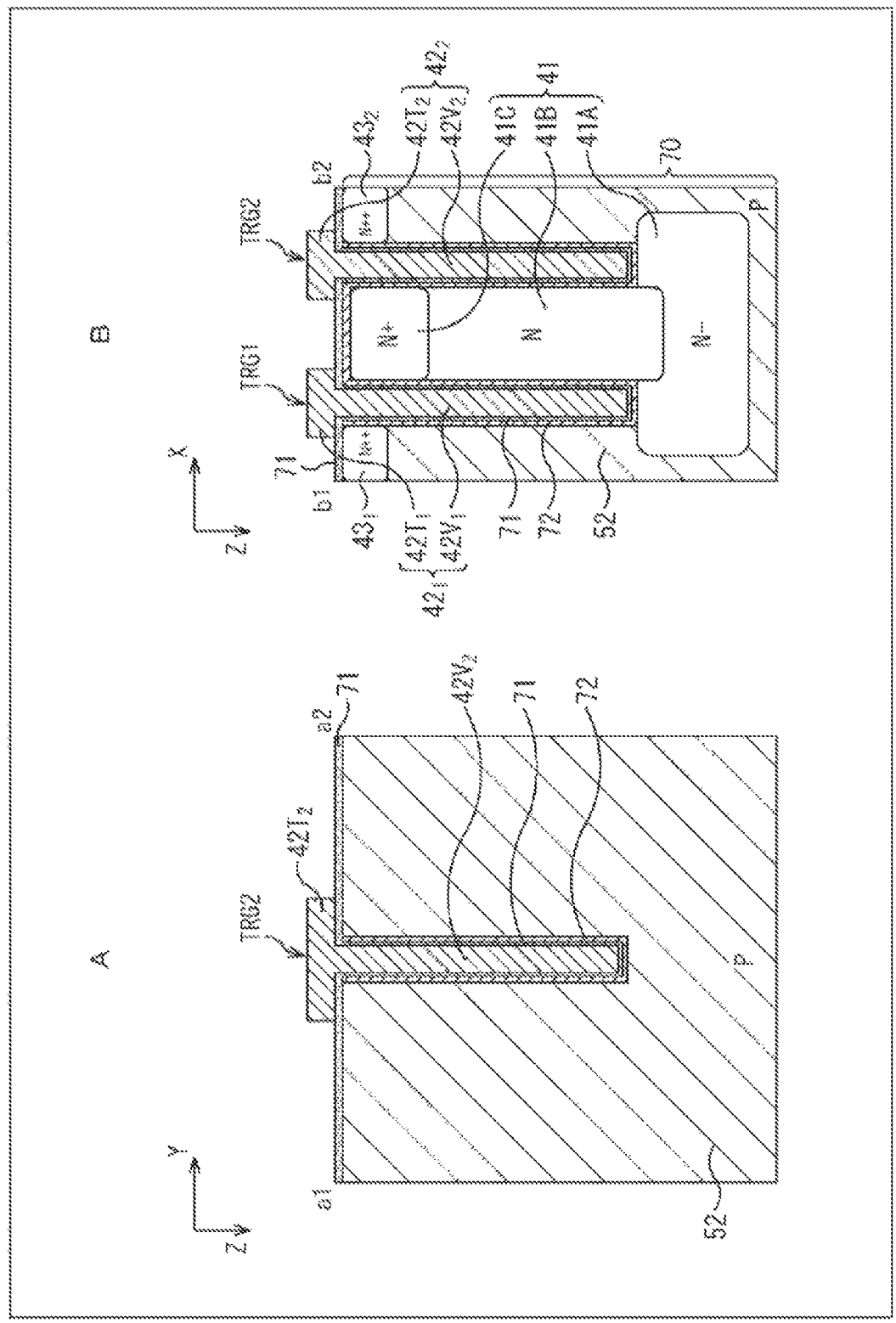
FIG. 14 is a cross-sectional view illustrating the modification of the pixel.

FIGS. 13 and 14 are diagrams illustrating a modification of the pixel 10.

FIG. 13 is a plan view of the modification of the pixel 10, and FIG. 14 is a cross-sectional view of the modification of the pixel 10. The plan view of FIG. 13 corresponds to the plan view of the pixel 10 illustrated in FIG. 3, and the cross-sectional view of FIG. 14 corresponds to the cross-sectional view of the pixel 10 illustrated in FIG. 4.

The modification illustrated in FIGS. 13 and 14 illustrates a pixel structure in a case where capacitances of the floating diffusion regions FD1 and FD2 are reduced to increase the conversion efficiency. The circuit configuration of the pixel 10 is the same as that of the equivalent circuit illustrated in FIG. 2.

As illustrated in the plan view of FIG. 13, areas (volumes) of the N-type semiconductor regions $43_1$ and $43_2$ as the floating diffusion regions FD1 and FD2 are formed smaller than those in FIG. 3. A gate width 201 of the gate electrodes $42_1$ and $42_2$ of the transfer transistors TRG1 and TRG2 is also shorter than the gate width 61 of the pixel 10 in FIG. 3.

Arrangement of the pixel transistors of the transfer transistor TRG, the switching transistor FDG, the reset transistor RST, the amplification transistor AMP, and the selection transistor SEL are changed due to the change in the region size of the N-type semiconductor regions $43_1$ and $43_2$ as the floating diffusion regions FD1 and FD2. For example, the N-type semiconductor region $51_1$ as the source region of the selection transistors SEL1 and SEL2 is formed in a region of the pixel 10 adjacent in the vertical direction.

In FIG. 13, the N-type semiconductor region $43_1$ that functions as the floating diffusion region FD1 is connected to the gate electrode $48_1$ of the amplification transistor AMP1 via the wiring line $151_1$, and the N-type semiconductor region $43_2$ that functions as the floating diffusion region FD2 is connected to the gate electrode $48_2$ of the amplification transistor AMP2 via the wiring line $151_2$.

A of FIG. 14 is a cross-sectional view of the pixel 10 on a line a1-a2 of FIG. 13, and B of FIG. 14 is a cross-sectional view of the pixel 10 on a line b1-b2 of FIG. 13.

Note that, the cross-sectional view on the line b1-b2 of the modification of the pixel 10 illustrated in B of FIG. 14 is similar to the cross-sectional view of B in FIG. 4, and the description thereof will be omitted.

In the modification of the pixel 10, the area (volume) of the N-type semiconductor region 43 as the floating diffusion region FD is formed smaller than that in FIG. 3, and the gate width 201 of the gate electrode 42 of the transfer transistor TRG is also formed shorter, so that the number of vertical gate electrode portions 42V is also smaller than that in FIG. 3. Specifically, as illustrated in A of FIG. 14, the gate electrode $42_2$ of the transfer transistor TRG2 includes the planar gate electrode portion $42T_2$ and one vertical gate electrode portion $42V_2$.

Note that, the number of vertical gate electrode portions 42V may be a plural number, such as two or three, depending on the gate width 201 of the gate electrode 42 of the transfer transistor TRG.

<11. Configuration Example of Pixel with Four Taps>

Figure 15:
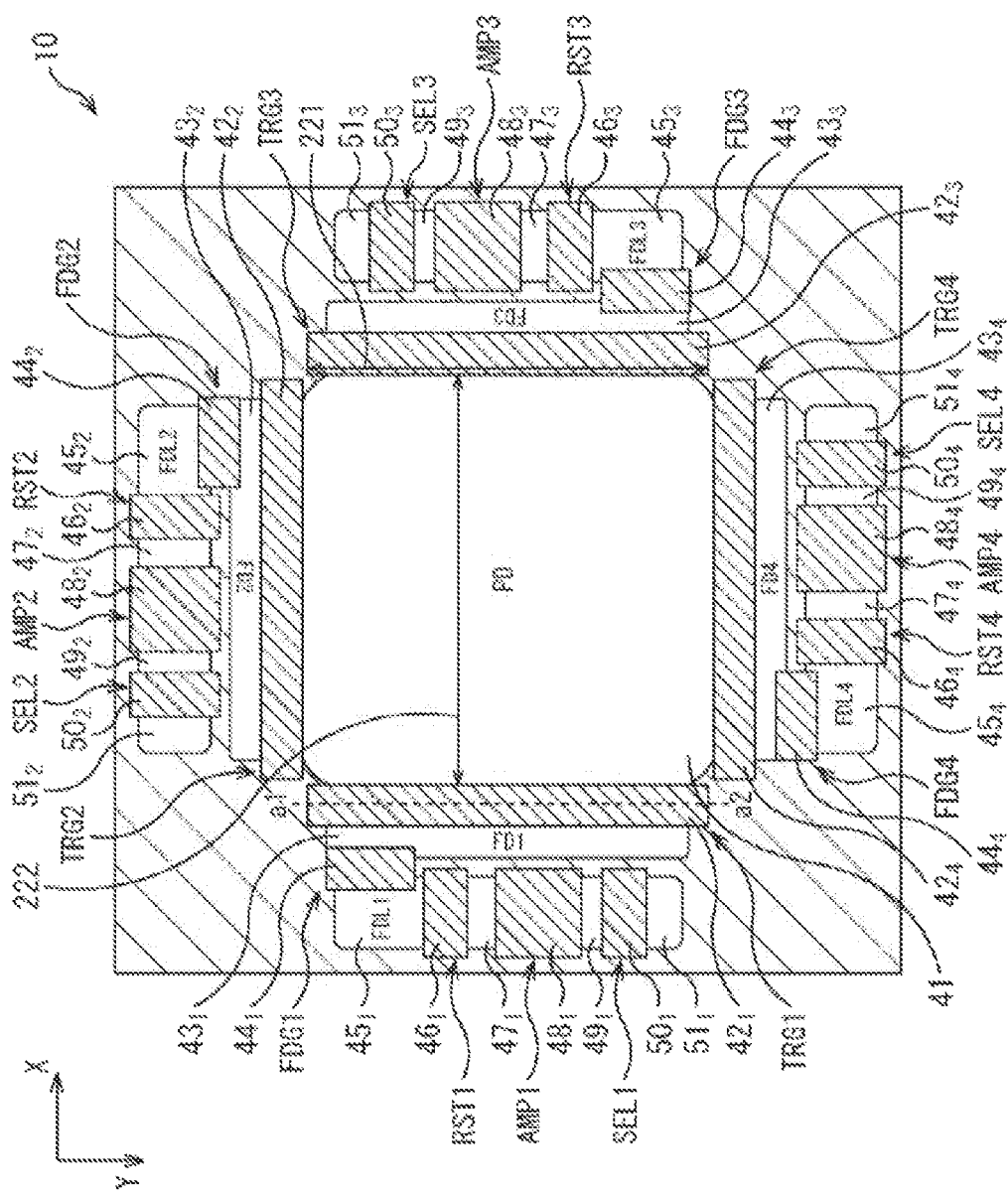
FIG. 15 is a plan view of a pixel with four taps.

FIG. 15 is a plan view illustrating still another modification of the pixel 10.

The pixel 10 illustrated in FIGS. 3 and 13 has a pixel structure with two taps in which two transfer transistors TRG1 and TRG2 and two floating diffusion regions FD1 and FD2 are included for one photodiode PD, and the electric charge generated by the photodiode PD is distributed to the two floating diffusion regions FD1 and FD2.

On the other hand, the pixel 10 illustrated in FIG. 15 has a pixel structure with four taps in which four transfer transistors TRG1 to TRG4 and four floating diffusion regions FD1 to FD4 are included for one photodiode PD, and the electric charge generated by the photodiode PD is distributed to the four floating diffusion regions FD1 to FD4.

The pixel 10 includes four transfer transistors TRG, four floating diffusion regions FD, four additional capacitances FDL, four switching transistors FDG, four reset transistors RST, four amplification transistors AMP, and four selection transistors SEL.

Arrangement of one set including a combination of the transfer transistor TRG, the floating diffusion region FD, the additional capacitance FDL, the switching transistor FDG, the reset transistor RST, the amplification transistor AMP, and the selection transistor SEL is similar to that in FIG. 3.

In the pixel with two taps illustrated in FIG. 3, the combination (one set) of the transfer transistor TRG, the floating diffusion region FD, the additional capacitance FDL, the switching transistor FDG, the reset transistor RST, the amplification transistor AMP, and the selection transistor SEL is arranged only in the two sides facing each other of a rectangular pixel region, whereas in the pixel with four taps in FIG. 15, the combination is arranged in each side.

In the pixel with four taps in FIG. 15, any one of subscripts of 1 to 4 is attached to each set of the transfer transistor TRG, the floating diffusion region FD, the additional capacitance FDL, the switching transistor FDG, the reset transistor RST, the amplification transistor AMP, and the selection transistor SEL, to distinguish the set.

The cross-sectional view of the pixel 10 on a line a1-a2 of FIG. 15 is similar to that in A of FIG. 4, and all the transfer transistors TRG include vertical transistors. Note that, of course, the number of vertical gate electrode portions 42V of the transfer transistor TRG may be different from that in the case of the pixel with two taps.

In the pixel 10 with four taps, as illustrated in FIG. 15, a distance 222 between the gate electrodes 42 of the two transfer transistors TRG facing each other is about the same length as a gate width 221 of the gate electrode 42 of the transfer transistor TRG; however, modulation capability is increased by using a vertical transistor as the transfer transistor TRG, and the second drive of applying the second negative bias VC greater than the first negative bias VB for pinning is performed to the transfer transistor TRG on the side to be turned off, whereby high-speed transfer of the electric charge is possible.

Figure 16:
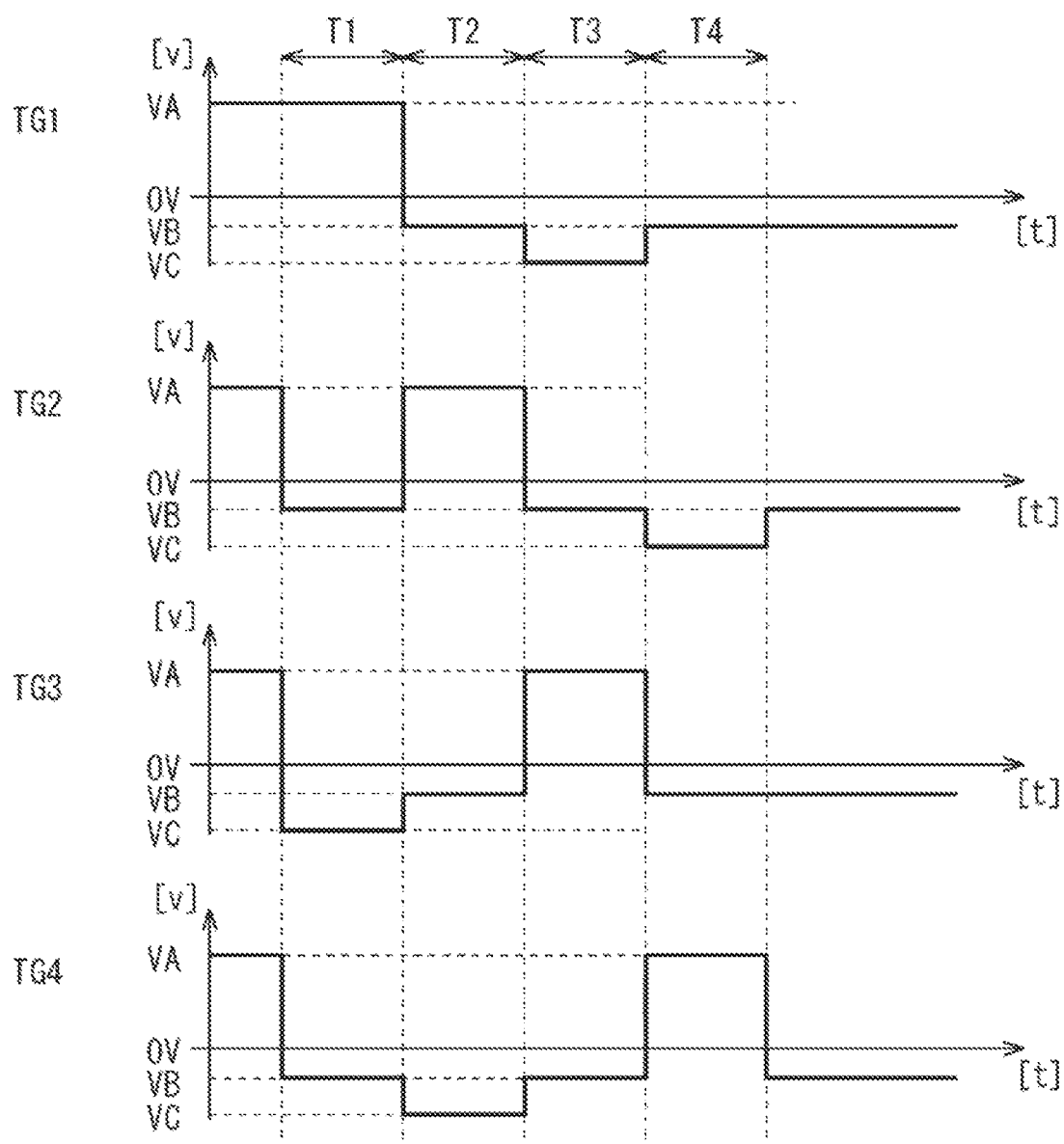
FIG. 16 is a diagram explaining drive of the pixel with four taps.

FIG. 16 is a timing chart explaining the second drive in the pixel 10 with four taps.

In a case where the second drive is performed in the pixel 10 with four taps, the vertical drive unit 22 performs control of setting the second negative bias VC for the transfer transistor TRG facing the predetermined one transfer transistor TRG controlled to be turned on, and setting the first negative bias VB for the remaining two orthogonal transfer transistors TRG.

In the example of FIG. 16, in a period T1, the vertical drive unit 22 turns on the transfer transistor TRG1 and performs control of setting the second negative bias VC for the transfer transistor TRG3, and performs control of setting the first negative bias VB for the transfer transistors TRG2 and TRG4.

In a period T2 following the period T1, the vertical drive unit 22 turns on the transfer transistor TRG2, and performs control of setting the second negative bias VC for the transfer transistor TRG4 and performs control of setting the first negative bias VB for the transfer transistors TRG1 and TRG3.

In a period T3 following the period T2, the vertical drive unit 22 turns on the transfer transistor TRG3, and performs control of setting the second negative bias VC for the transfer transistor TRG1 and performs control of setting the first negative bias VB for the transfer transistors TRG2 and TRG4.

In a period T4 following the period T3, the vertical drive unit 22 turns on the transfer transistor TRG4, and performs control of setting the second negative bias VC for the transfer transistor TRG2 and performs setting of the first negative bias VB for the transfer transistors TRG1 and TRG3.

<12. Application to Electric Field Control Type Light Receiving Element>

Figure 17:
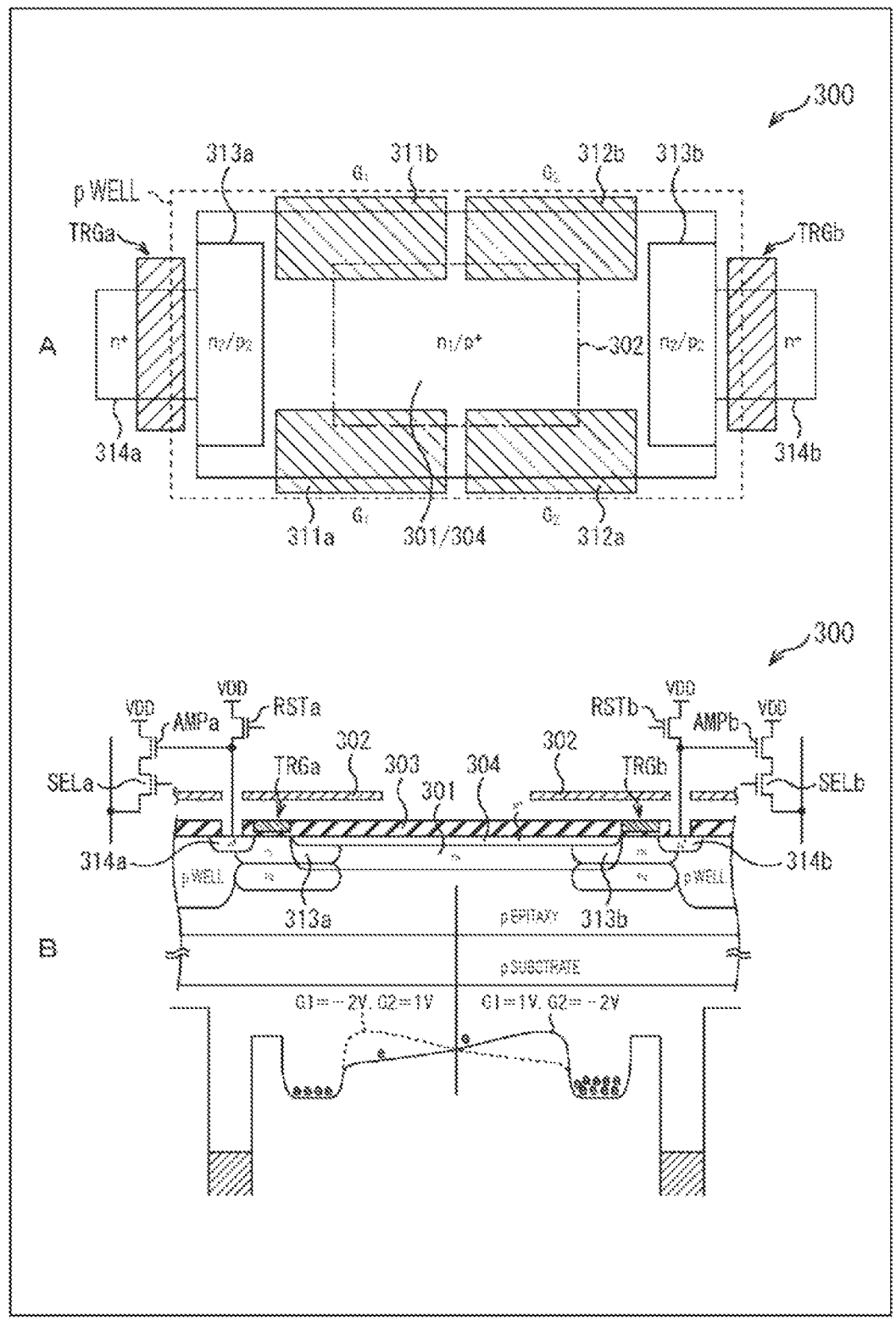
FIG. 17 is a diagram explaining application to an electric field control type light receiving element.

The structure of the vertical transistor of the light receiving element 1 described above can also be applied to an electric field control type light receiving element as illustrated in FIG. 17.

A of FIG. 17 is a plan view of a pixel of the electric field control type light receiving element, and B of FIG. 17 is a cross-sectional view and a potential diagram of the pixel of the electric field control type light receiving element.

In a pixel 300 of the electric field control type light receiving element, electric field control voltages different from each other are respectively applied to a pair of first electric field control electrodes 311a and 311b, and a pair of second electric field control electrodes 312a and 312b adjacent to the pair of first electric field control electrodes 311a and 311b, whereby an electric charge generated in an N-type semiconductor region 301 that is a photoelectric conversion region is distributed to two charge storage regions 313a and 313b. Electric charges stored in the two charge storage regions 313a and 313b are transferred to charge reading regions 314a and 314b by transfer transistors TRGa and TRGb, respectively.

Light passing through a rectangular opening region of a light shielding plate 302 illustrated in B of FIG. 17 is incident on the N-type semiconductor region 301 that is the photoelectric conversion region. The pair of first electric field control electrodes 311a and 311b illustrated in A of FIG. 17 and the pair of second electric field control electrodes 312a and 312b adjacent to the pair of first electric field control electrodes 311a and 311b are arranged between the light shielding plate 302 and an insulating film 303. A P-type semiconductor region 304 between the N-type semiconductor region 301 and the insulating film 303 is a pinning layer.

For example, in a case where a voltage of −2 V is applied to the pair of first electric field control electrodes 311a and 311b, and a voltage of 1 V is applied to the pair of second electric field control electrodes 312a and 312b adjacent to the pair of first electric field control electrodes 311a and 311b, the electric charge generated by photoelectric conversion is transferred to the charge storage region 313b on the right side.

On the other hand, in a case where a voltage of 1 V is applied to the pair of first electric field control electrodes 311a and 311b, and a voltage of −2 V is applied to the pair of second electric field control electrodes 312a and 312b adjacent to the pair of first electric field control electrodes 311a and 311b, the electric charge generated by photoelectric conversion is transferred to the charge storage region 313a on the left side.

Instead of the first electric field control electrodes 311a and 311b and the second electric field control electrodes 312a and 312b of the pixel 300 of the electric field control type light receiving element as described above, it is possible to adopt the configuration of the transfer transistors TRG1 and TRG2 described above, that is, a configuration of the vertical transistor including the comb-teeth shape vertical gate electrode portion 42V. As a result, the modulation capability is improved and an electric field is easily applied, so that the transfer characteristics can be improved.

<13. Configuration Example of Distance Measurement Module>

Figure 18:
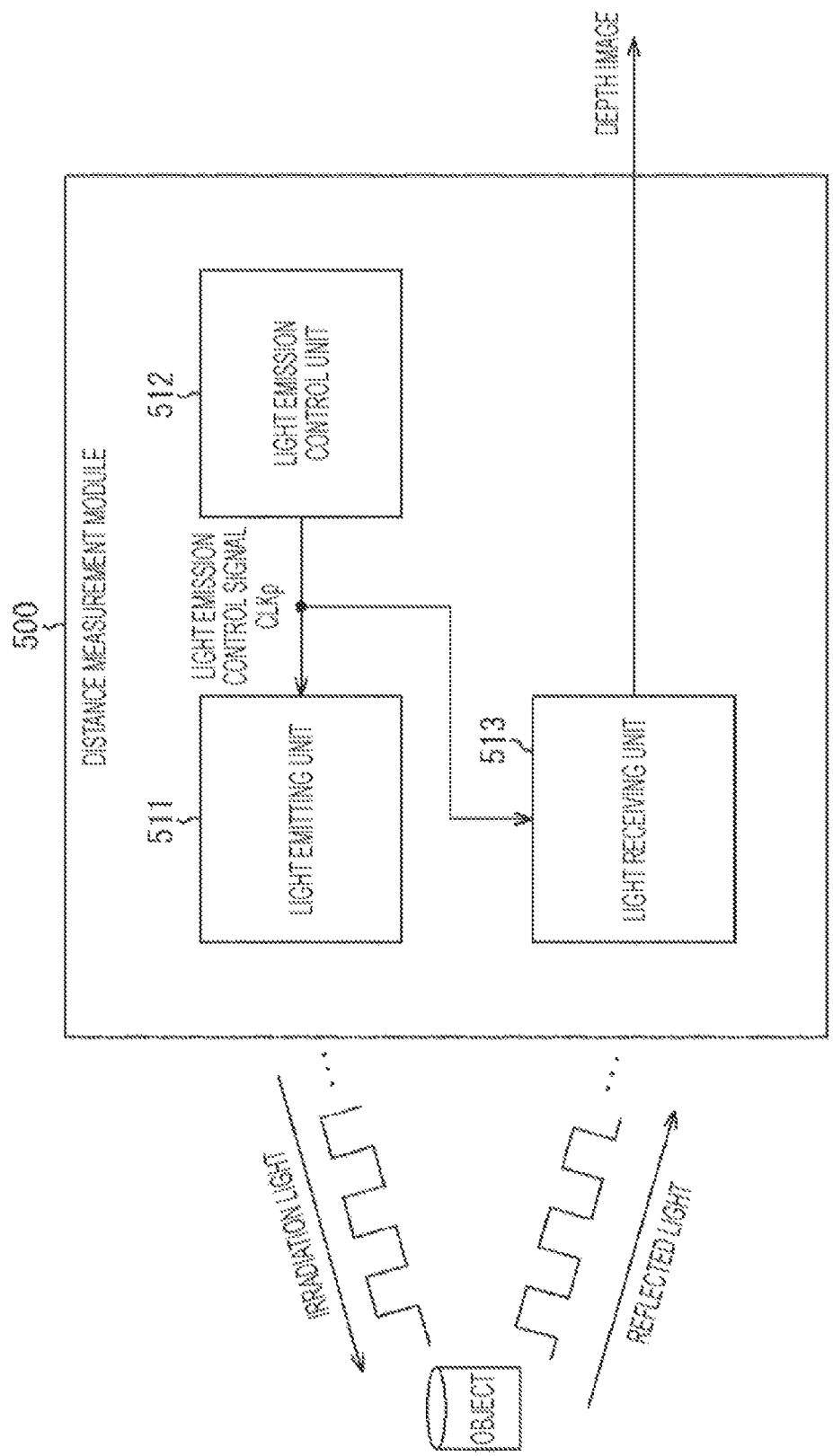
FIG. 18 is a block diagram illustrating a configuration example of a distance measurement module to which the present technology is applied.

FIG. 18 is a block diagram illustrating a configuration example of a distance measurement module that outputs distance measurement information by using the light receiving element 1 described above.

A distance measurement module 500 includes a light emitting unit 511, a light emission control unit 512, and a light receiving unit 513.

The light emitting unit 511 includes a light source that emits light having a predetermined wavelength, and emits irradiation light whose brightness fluctuates periodically to irradiate an object. For example, the light emitting unit 511 includes a light emitting diode that emits infrared light having a wavelength in a range of 780 nm to 1000 nm as a light source, and generates the irradiation light in synchronization with a light emission control signal CLKp of a square wave supplied from the light emission control unit 512.

Note that, the light emission control signal CLKp is not limited to a square wave as long as it is a periodic signal. For example, the light emission control signal CLKp may be a sine wave.

The light emission control unit 512 supplies the light emission control signal CLKp to the light emitting unit 511 and the light receiving unit 513, and controls an irradiation timing of the irradiation light. A frequency of the light emission control signal CLKp is, for example, 20 megahertz (MHz). Note that, the frequency of the light emission control signal CLKp is not limited to 20 megahertz (MHz) and may be 5 megahertz (MHz) or the like.

The light receiving unit 513 receives reflected light reflected from the object, calculates distance information for each pixel depending on a light receiving result, and generates and outputs a depth image in which a distance to the object is represented by a gradation value for each pixel.

The light receiving element 1 of FIG. 1 is used for the light receiving unit 513. The light receiving element 1 as the light receiving unit 513 alternately drives the plurality of transfer transistors TRG of each pixel 10 of the pixel array unit 21 on the basis of the light emission control signal CLKp, for example, and transfers an electric charge generated by the photodiode PD to a plurality of charge storage units (floating diffusion region FD). The light receiving element 1 calculates distance information for each pixel from signal intensities detected in the plurality of charge storage units.

As described above, the light receiving element 1 described above can be incorporated as the light receiving unit 513 of the distance measurement module 500 that obtains and outputs distance information to a subject by the indirect ToF method. As a result, distance measurement characteristics as the distance measurement module 500 can be improved.

<14. Configuration Example of Electronic Device>

Note that, in addition to being applicable to the distance measurement module as described above, the light receiving element 1 can be applied to various electronic devices, for example, an imaging device such as a digital still camera or a digital video camera having a distance measurement function, and a smartphone having a distance measurement function.

Figure 19:
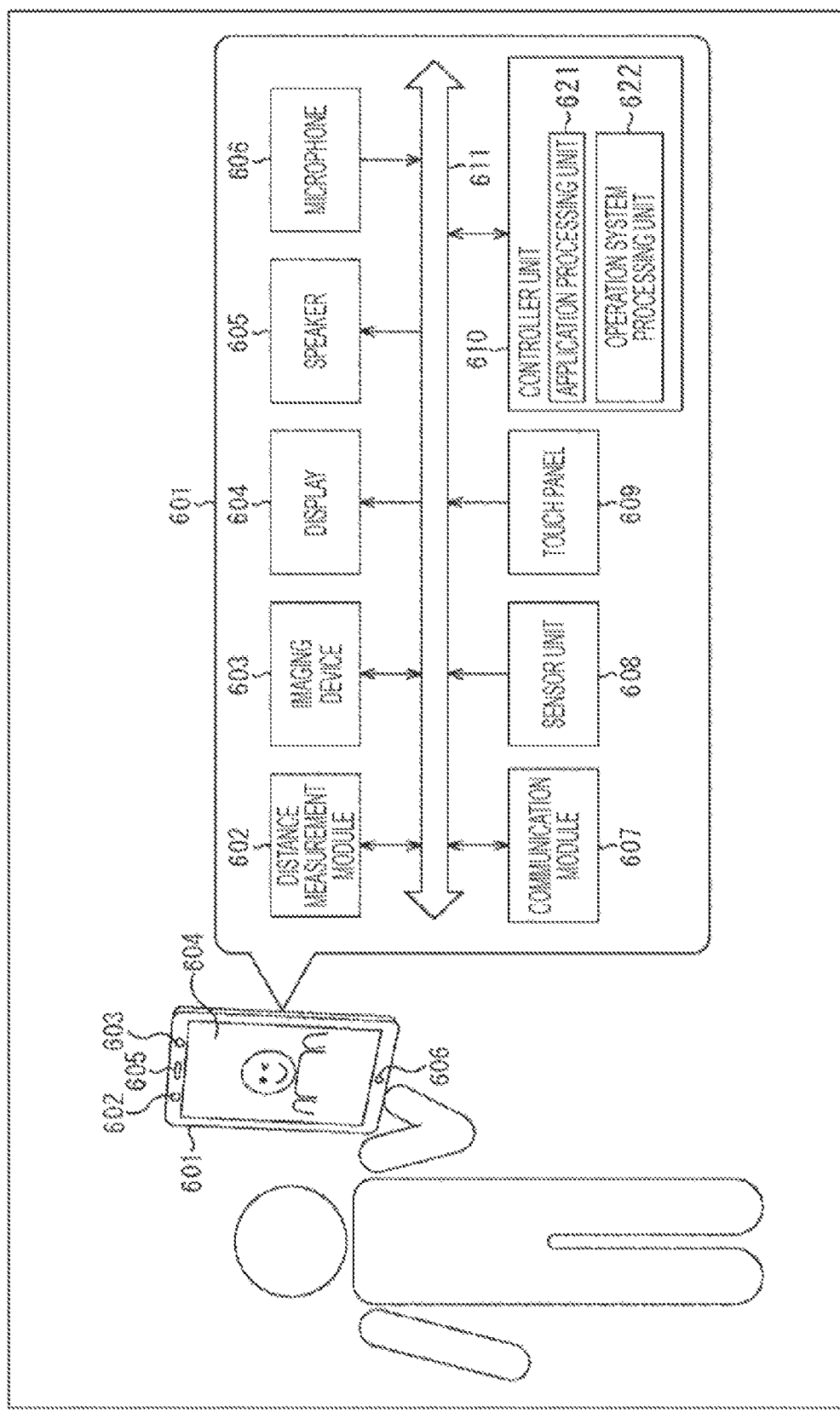
FIG. 19 is a block diagram illustrating a configuration example of a smartphone as an electronic device to which the present technology is applied.

FIG. 19 is a block diagram illustrating a configuration example of a smartphone as an electronic device to which the present technology is applied.

As illustrated in FIG. 19, a smartphone 601 includes a distance measurement module 602, an imaging device 603, a display 604, a speaker 605, a microphone 606, a communication module 607, a sensor unit 608, a touch panel 609, and a controller unit 610 that are connected to each other via a bus 611. Furthermore, the controller unit 610 has functions as an application processing unit 621 and an operation system processing unit 622 by executing a program by a CPU.

The distance measurement module 500 of FIG. 18 is applied to the distance measurement module 602. For example, the distance measurement module 602 is arranged in front of the smartphone 601 and performs distance measurement for a user of the smartphone 601, thereby being able to output depth values of the surface shapes of the user's face, hand, finger, and the like as distance measurement results.

The imaging device 603 is arranged in front of the smartphone 601 and performs imaging of the user of the smartphone 601 as a subject, thereby acquiring an image of the user. Note that, although not illustrated, the imaging device 603 may be arranged on the back surface of the smartphone 601.

The display 604 displays an operation screen for performing processing by the application processing unit 621 and the operation system processing unit 622, an image captured by the imaging device 603, and the like. The speaker 605 and the microphone 606 output the voice of the other party and collect the voice of the user when a call is made with the smartphone 601, for example.

The communication module 607 performs network communication via a communications network such as the Internet, a public telephone line network, a wide area communication network for wireless mobile body such as so-called 3G lines and 4G lines, a Wide Area Network (WAN), and a Local Area Network (LAN), short-range wireless communication such as Bluetooth (registered trademark) and Near Field Communication (NFC), and the like. The sensor unit 608 senses speed, acceleration, proximity, and the like, and the touch panel 609 acquires a user's touch operation on the operation screen displayed on the display 604.

The application processing unit 621 performs processing for providing various services by the smartphone 601. For example, the application processing unit 621 can perform processing of creating a face by computer graphics that virtually reproduces the user's facial expression on the basis of the depth value supplied from the distance measurement module 602, and displaying the face on the display 604. Furthermore, the application processing unit 621 can perform processing of creating, for example, three-dimensional shape data of an arbitrary three-dimensional object on the basis of the depth value supplied from the distance measurement module 602.

The operation system processing unit 622 performs processing for implementing basic functions and operations of the smartphone 601. For example, the operation system processing unit 622 can perform processing of authenticating the user's face and unlocking the smartphone 601 on the basis of the depth value supplied from the distance measurement module 602. Furthermore, the operation system processing unit 622 can perform, for example, processing of recognizing the user's gesture on the basis of the depth value supplied from the distance measurement module 602, and performs processing of inputting various operations corresponding to the gesture.

In the smartphone 601 configured as described above, by applying the distance measurement module 500 described above as the distance measurement module 602, for example, it is possible to measure and display a distance to a predetermined object, perform processing of creating and displaying three-dimensional shape data of a predetermined object, or the like.

<15. Application Example to Endoscopic Surgical System>

The technology according to the present disclosure (the present technology) can be applied to various products. For example, the technology according to the present disclosure may be applied to an endoscopic surgical system.

Figure 20:
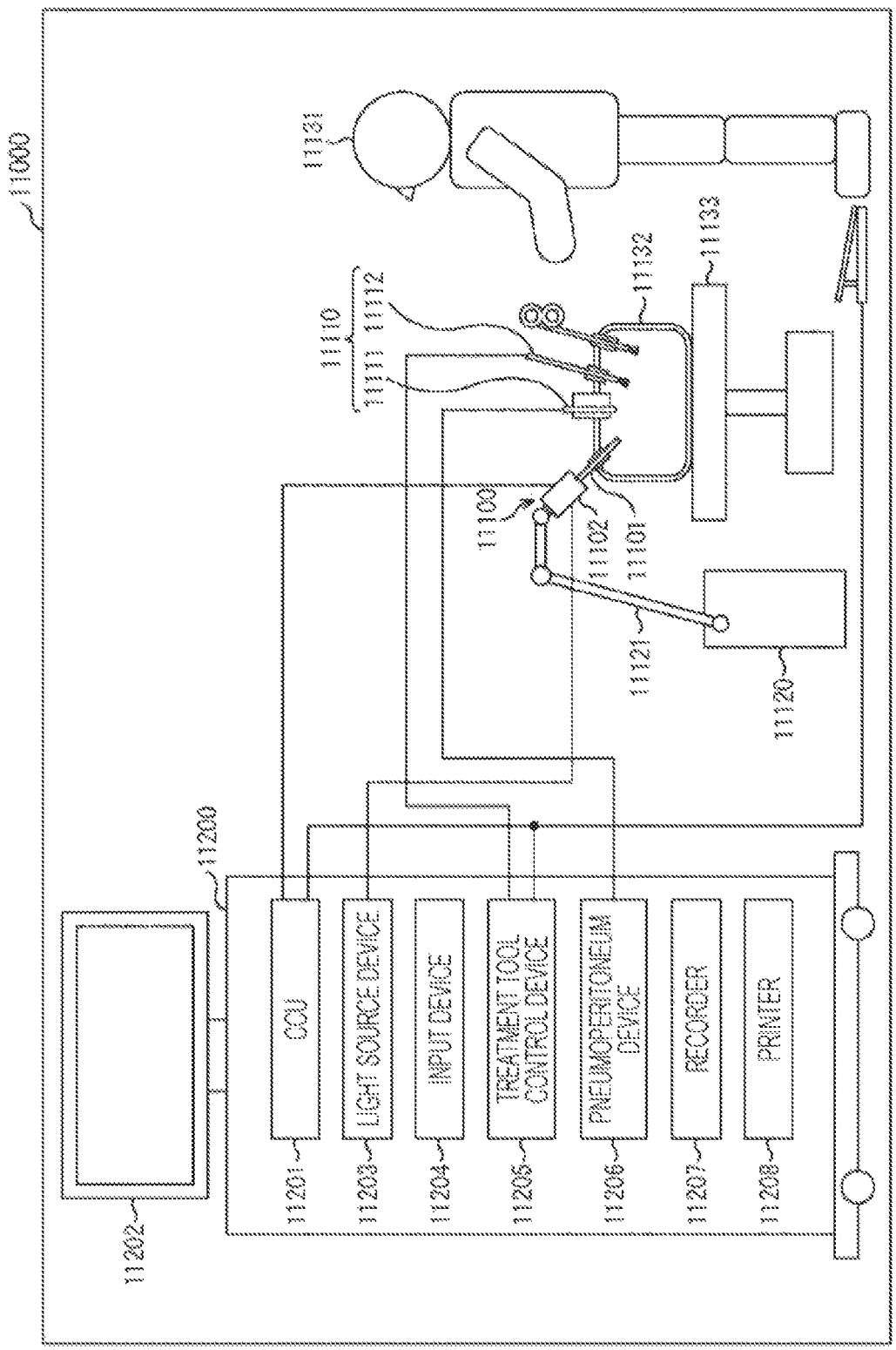
FIG. 20 is a diagram illustrating an example of a schematic configuration of an endoscopic surgical system.

FIG. 20 is a diagram illustrating an example of a schematic configuration of an endoscopic surgical system to which the technology according to the present disclosure (the present technology) can be applied.

FIG. 20 illustrates a state in which a surgeon (doctor) 11131 is performing surgery on a patient 11132 on a patient bed 11133 using an endoscopic surgical system 11000. As illustrated, the endoscopic surgical system 11000 includes an endoscope 11100, other surgical tools 11110 such as a pneumoperitoneum tube 11111 and an energy treatment tool 11112, a support arm device 11120 that supports the endoscope 11100, and a cart 11200 on which various devices for endoscopic surgery are mounted.

The endoscope 11100 includes a lens barrel 11101 in which a region of a predetermined length from the distal end is inserted into the body cavity of the patient 11132, and a camera head 11102 connected to the proximal end of the lens barrel 11101. In the illustrated example, the endoscope 11100 formed as a so-called rigid scope including a rigid lens barrel 11101 is illustrated, but the endoscope 11100 may be formed as a so-called flexible scope including a flexible lens barrel.

At the distal end of the lens barrel 11101, an opening is provided into which an objective lens is fitted. A light source device 11203 is connected to the endoscope 11100, and light generated by the light source device 11203 is guided to the distal end of the lens barrel by a light guide extending inside the lens barrel 11101, and the light is emitted toward an observation target in the body cavity of the patient 11132 via the objective lens. Note that, the endoscope 11100 may be a forward-viewing endoscope, an oblique-viewing endoscope, or a side-viewing endoscope.

An optical system and an imaging element are provided inside the camera head 11102, and reflected light (observation light) from the observation target is focused on the imaging element by the optical system. The observation light is photoelectrically converted by the imaging element, and an electric signal corresponding to the observation light, that is, an image signal corresponding to the observation image is generated. The image signal is transmitted as RAW data to a camera control unit (CCU) 11201.

The CCU 11201 includes a central processing unit (CPU), a graphics processing unit (GPU), and the like, and comprehensively controls operation of the endoscope 11100 and a display device 11202. Moreover, the CCU 11201 receives the image signal from the camera head 11102 and applies various types of image processing to the image signal, for example, development processing (demosaic processing), and the like, for displaying the image based on the image signal.

The display device 11202 displays an image based on the image signal subjected to the image processing by the CCU 11201, by the control from the CCU 11201.

The light source device 11203 includes a light source, for example, a light emitting diode (LED) or the like, and supplies irradiation light for imaging a surgical portion or the like to the endoscope 11100.

An input device 11204 is an input interface to the endoscopic surgical system 11000. A user can input various types of information and instructions to the endoscopic surgical system 11000 via the input device 11204. For example, the user inputs an instruction or the like to change imaging conditions (type of irradiation light, magnification, focal length, and the like) for the endoscope 11100.

A treatment tool control device 11205 controls drive of the energy treatment tool 11112 for cauterization of tissue, incision, sealing of blood vessels, or the like. A pneumoperitoneum device 11206 injects a gas into the body cavity of the patient 11132 via the pneumoperitoneum tube 11111 to inflate the body cavity, for the purpose of ensuring a field of view by the endoscope 11100 and ensuring a working space of the surgeon. A recorder 11207 is a device capable of recording various types of information regarding surgery. A printer 11208 is a device capable of printing various types of information regarding surgery in various formats such as text, image, graph, and the like.

Note that, the light source device 11203 that supplies irradiation light for imaging a surgical portion to the endoscope 11100 can include a white light source including, for example, an LED, a laser light source, or a combination thereof. In a case where the white light source includes a combination of R, G, and B laser light sources, the output intensity and the output timing of each color (each wavelength) can be controlled with high accuracy, so that adjustment can be performed of the white balance of the captured image in the light source device 11203. Furthermore, in this case, it is also possible to capture an image corresponding to each of R, G, and B in time division by emitting the laser light from each of the R, G, and B laser light sources in time division to the observation target, and controlling drive of the imaging element of the camera head 11102 in synchronization with the irradiation timing. According to this method, a color image can be obtained without providing a color filter in the imaging element.

Furthermore, drive of the light source device 11203 may be controlled such that the intensity of light to be output is changed at predetermined time intervals. By controlling the drive of the imaging element of the camera head 11102 in synchronization with the change timing of the light intensity to acquire images in time division, and synthesizing the images, a high dynamic range image can be generated without so-called blocked up shadows or blown out highlights.

Furthermore, the light source device 11203 may be able to supply light of a predetermined wavelength band corresponding to special light observation. In the special light observation, for example, by using wavelength dependence of light absorption in a body tissue, by emitting narrow band light compared to irradiation light (in other words, white light) at the time of ordinary observation, so-called narrow band imaging is performed in which a predetermined tissue such as a blood vessel in a mucosal surface layer is imaged with high contrast. Alternatively, in the special light observation, fluorescence observation may be performed that obtain an image by fluorescence generated by emitting excitation light. In the fluorescence observation, it is possible to irradiate a body tissue with excitation light to observe the fluorescence from the body tissue (autofluorescence observation), or to locally inject a reagent such as indocyanine green (ICG) into a body tissue and irradiate the body tissue with excitation light corresponding to the fluorescence wavelength of the reagent to obtain a fluorescent image, for example. The light source device 11203 may be able to supply narrow band light and/or excitation light corresponding to such special light observation.

Figure 21:
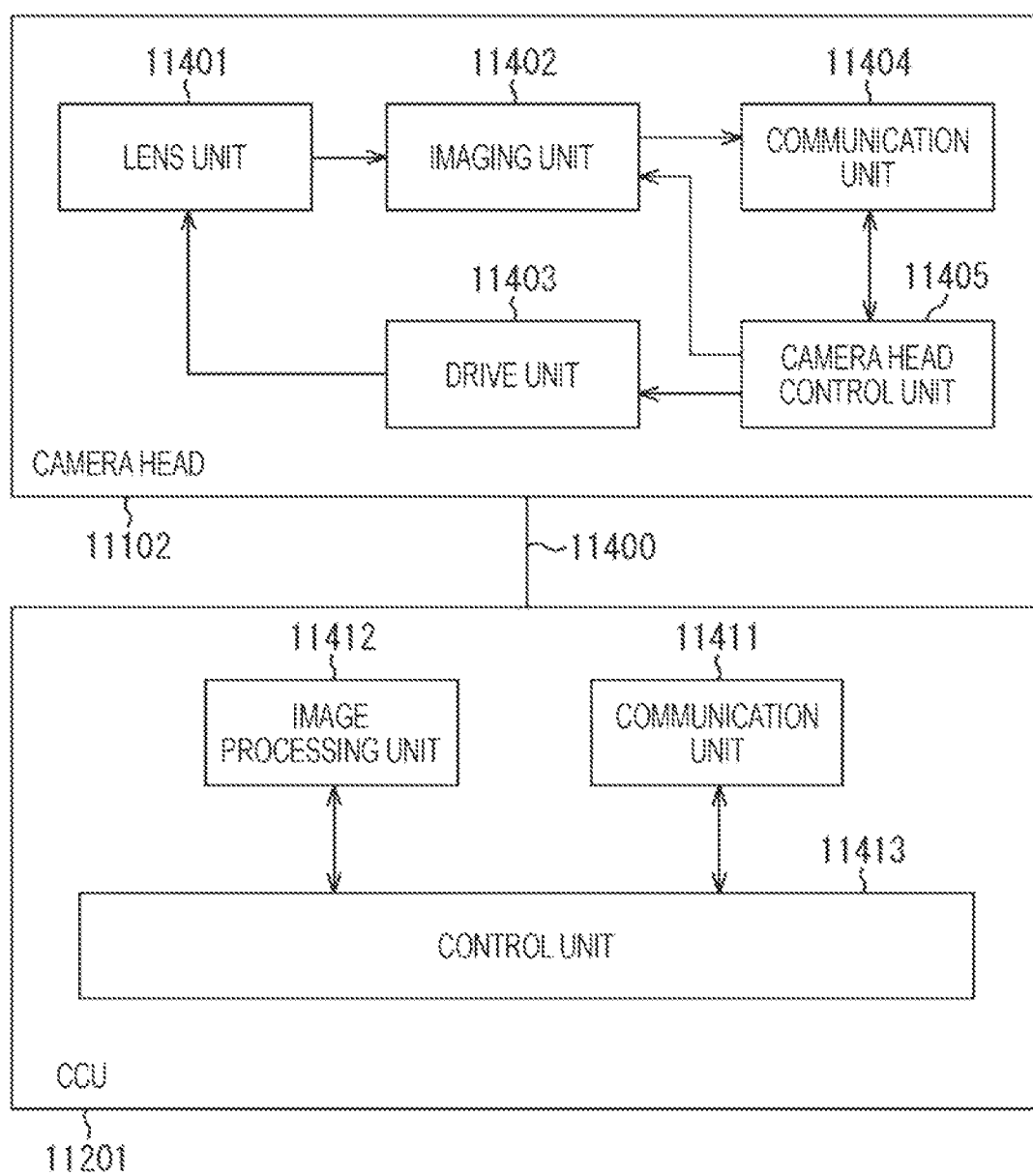
FIG. 21 is a block diagram illustrating an example of a functional configuration of a camera head and a CCU.

FIG. 21 is a block diagram illustrating an example of a functional configuration of the camera head 11102 and the CCU 11201 illustrated in FIG. 20.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connection portion with the lens barrel 11101. The observation light taken in from the distal end of the lens barrel 11101 is guided to the camera head 11102 and is incident on the lens unit 11401. The lens unit 11401 includes a combination of a plurality of lenses including a zoom lens and a focus lens.

The imaging unit 11402 includes an imaging element. The imaging element constituting the imaging unit 11402 may be one (so-called single-chip) element, or a plurality of (so-called multi-chip) elements. In a case where the imaging unit 11402 includes the multi-chip type, for example, image signals corresponding to R, G, and B are generated by respective imaging elements, and the image signals are synthesized, whereby a color image may be obtained.

Alternatively, the imaging unit 11402 may include a pair of imaging elements for acquiring right-eye and left-eye image signals corresponding to three-dimensional (3D) display. The 3D display is performed, whereby the surgeon 11131 can grasp the depth of living tissue in a surgical portion more accurately. Note that, in a case where the imaging unit 11402 includes the multi-chip type, a plurality of systems of the lens units 11401 can be provided corresponding to respective imaging elements.

Furthermore, the imaging unit 11402 is not necessarily provided in the camera head 11102. For example, the imaging unit 11402 may be provided inside the lens barrel 11101 immediately after the objective lens.

The drive unit 11403 includes an actuator and moves the zoom lens and the focus lens of the lens unit 11401 by a predetermined distance along the optical axis by control of the camera head control unit 11405. As a result, the magnification and the focus of the captured image by the imaging unit 11402 can be appropriately adjusted.

The communication unit 11404 includes a communication device for transmitting/receiving various types of information to/from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling drive of the camera head 11102 from the CCU 11201, and supplies the control signal to the camera head control unit 11405. The control signal includes information regarding imaging conditions, for example, information that specifies the frame rate of the captured image, information that specifies the exposure value at the time of imaging, information that specifies the magnification and focus of the captured image, and/or other information.

Note that, the above-described imaging conditions such as the frame rate, exposure value, magnification, and focus may be appropriately specified by the user, or automatically set by the control unit 11413 of the CCU 11201 on the basis of the acquired image signal. In the latter case, a so-called auto exposure (AE) function, auto-focus (AF) function, and auto white balance (AWB) function are installed in the endoscope 11100.

The camera head control unit 11405 controls the drive of the camera head 11102 on the basis of the control signal from the CCU 11201 received via the communication unit 11404.

The communication unit 11411 includes a communication device for transmitting/receiving various types of information to/from the camera head 11102. The communication unit 11411 receives the image signal transmitted from the camera head 11102 via the transmission cable 11400.

Furthermore, the communication unit 11411 transmits the control signal for controlling the drive of the camera head 11102 to the camera head 11102. The image signal and the control signal can be transmitted by electrical communication, optical communication, or the like.

The image processing unit 11412 performs various types of image processing on the image signal that is RAW data transmitted from the camera head 11102.

The control unit 11413 performs various types of control related to imaging of a surgical portion or the like by the endoscope 11100 and display of the captured image obtained by the imaging of the surgical portion or the like. For example, the control unit 11413 generates the control signal for controlling the drive of the camera head 11102.

Furthermore, the control unit 11413 causes the display device 11202 to display the captured image of the surgical portion or the like on the basis of the image signal subjected to the image processing by the image processing unit 11412. At this time, the control unit 11413 may recognize various objects in the captured image by using various image recognition technologies. For example, the control unit 11413 detects color, a shape of an edge, and the like of the object included in the captured image, thereby being able to recognize a surgical tool such as a forceps, a specific body part, bleeding, mist at the time of using the energy treatment tool 11112, or the like. When causing the display device 11202 to display the captured image, the control unit 11413 may cause the display device 11202 to superimpose and display various types of surgery assistance information on the image of the surgical portion by using the recognition result. The surgery assistance information is superimposed and displayed, and presented to the surgeon 11131, whereby the burden on the surgeon 11131 can be reduced, and the surgeon 11131 can reliably perform surgery.

The transmission cable 11400 connecting the camera head 11102 and the CCU 11201 together is an electric signal cable adaptable to communication of electric signals, an optical fiber adaptable to optical communication, or a composite cable thereof.

Here, in the illustrated example, communication is performed by wire using the transmission cable 11400, but communication between the camera head 11102 and the CCU 11201 may be performed wirelessly.

In the above, an example has been described of the endoscopic surgical system to which the technology according to the present disclosure can be applied. The technology according to the present disclosure can be applied to the imaging unit 11402 among the configurations described above. Specifically, the light receiving element 1 including the pixels 10 can be applied as a part of the configuration of the imaging unit 11402. By applying the technology according to the present disclosure as a part of the configuration of the imaging unit 11402, a distance to a surgical portion can be measured with high accuracy, and a clearer surgical portion image can be obtained.

Note that, the endoscopic surgical system has been described as an example here; however, the technology according to the present disclosure may be applied to others, for example, a microscopic surgical system, and the like.

<16. Application Example to Mobile Body>

The technology according to the present disclosure (the present technology) can be applied to various products. The technology according to the present disclosure may be implemented as a device mounted on any type of mobile body, for example, a car, an electric car, a hybrid electric car, a motorcycle, a bicycle, a personal mobility, an airplane, a drone, a ship, a robot, or the like.

Figure 22:
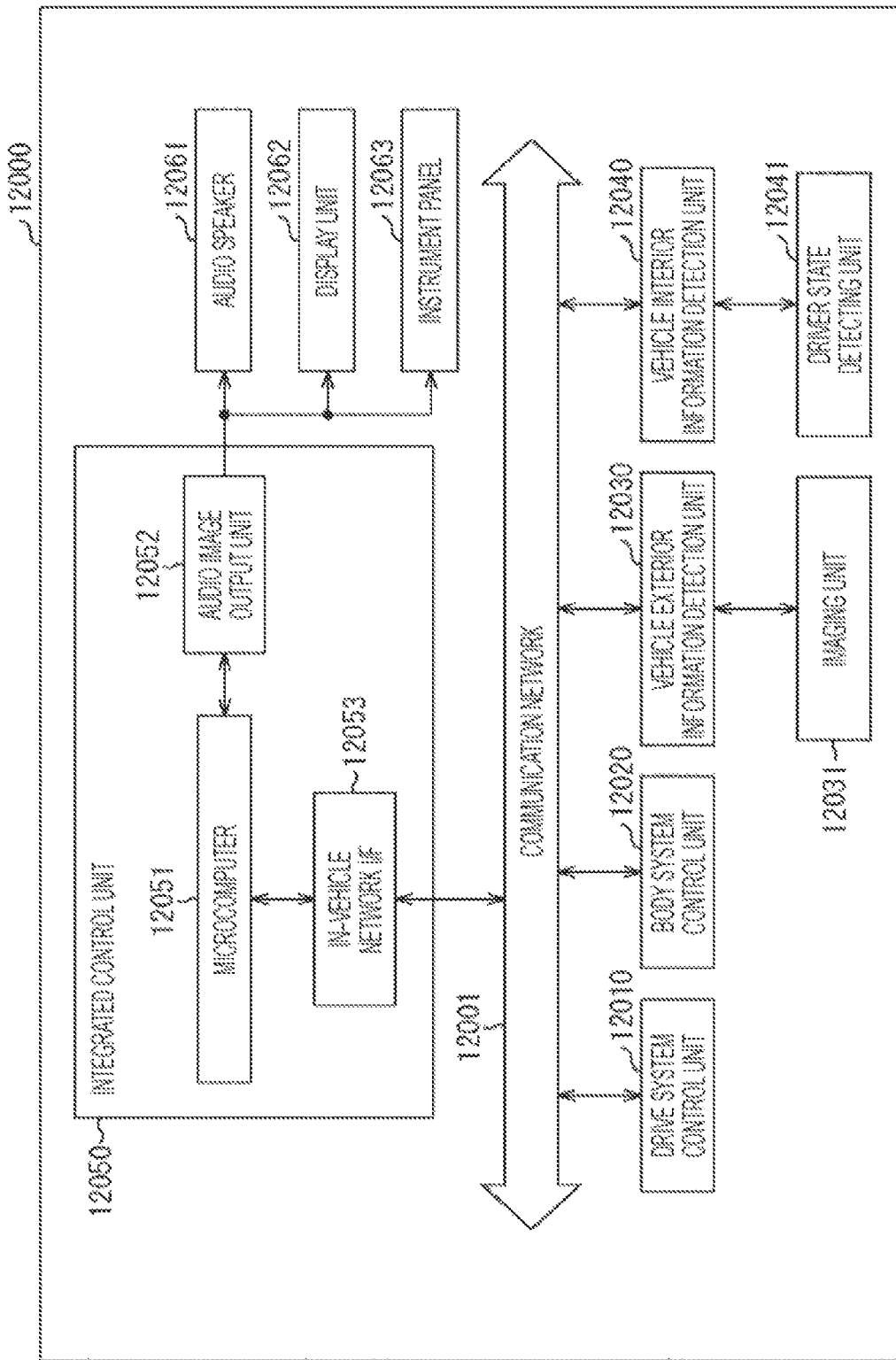
FIG. 22 is a block diagram illustrating an example of a schematic configuration of a vehicle control system.

FIG. 22 is a block diagram illustrating a schematic configuration example of a vehicle control system that is an example of a mobile body control system to which the technology according to the present disclosure can be applied.

The vehicle control system 12000 includes a plurality of electronic control units connected to each other via a communication network 12001. In the example illustrated in FIG. 22, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, an audio image output unit 12052, and an in-vehicle network interface (I/F) 12053 are illustrated.

The drive system control unit 12010 controls operation of devices related to a drive system of a vehicle in accordance with various programs. For example, the drive system control unit 12010 functions as a control device of a driving force generating device for generating driving force of the vehicle, such as an internal combustion engine or a driving motor, a driving force transmitting mechanism for transmitting driving force to wheels, a steering mechanism for adjusting a steering angle of the vehicle, a braking device for generating braking force of the vehicle, and the like.

The body system control unit 12020 controls operation of various devices equipped on the vehicle body in accordance with various programs. For example, the body system control unit 12020 functions as a control device of a keyless entry system, a smart key system, a power window device, or various lamps such as a head lamp, a back lamp, a brake lamp, a turn signal lamp, and a fog lamp. In this case, to the body system control unit 12020, a radio wave transmitted from a portable device that substitutes for a key, or signals of various switches can be input. The body system control unit 12020 accepts input of these radio waves or signals and controls a door lock device, power window device, lamp, and the like of the vehicle.

The vehicle exterior information detection unit 12030 detects information on the outside of the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle and receives the image captured. The vehicle exterior information detection unit 12030 may perform object detection processing or distance detection processing on a person, a car, an obstacle, a sign, a character on a road surface, or the like, on the basis of the received image.

The imaging unit 12031 is an optical sensor that receives light and outputs an electric signal depending on an amount of light received. The imaging unit 12031 can output the electric signal as an image, or as distance measurement information. Furthermore, the light received by the imaging unit 12031 may be visible light, or invisible light such as infrared rays.

The vehicle interior information detection unit 12040 detects information on the inside of the vehicle. The vehicle interior information detection unit 12040 is connected to, for example, a driver state detecting unit 12041 that detects a state of a driver. The driver state detecting unit 12041 includes, for example, a camera that captures an image of the driver, and the vehicle interior information detection unit 12040 may calculate a degree of fatigue or a degree of concentration of the driver, or determine whether or not the driver is dozing, on the basis of the detection information input from the driver state detecting unit 12041.

The microcomputer 12051 can calculate a control target value of the driving force generating device, the steering mechanism, or the braking device on the basis of the information on the inside and outside of the vehicle acquired by the vehicle exterior information detection unit 12030 or the vehicle interior information detection unit 12040, and output a control command to the drive system control unit 12010. For example, the microcomputer 12051 can perform cooperative control aiming for implementing functions of advanced driver assistance system (ADAS) including collision avoidance or shock mitigation of the vehicle, follow-up traveling based on an inter-vehicle distance, vehicle speed maintaining traveling, vehicle collision warning, vehicle lane departure warning, or the like.

Furthermore, the microcomputer 12051 can perform cooperative control aiming for automatic driving that autonomously travels without depending on operation of the driver, or the like, by controlling the driving force generating device, the steering mechanism, the braking device, or the like on the basis of information on the periphery of the vehicle acquired by the vehicle exterior information detection unit 12030 or the vehicle interior information detection unit 12040.

Furthermore, the microcomputer 12051 can output a control command to the body system control unit 12020 on the basis of information on the outside of the vehicle acquired by the vehicle exterior information detection unit 12030. For example, the microcomputer 12051 can perform cooperative control aiming for preventing dazzling such as switching from the high beam to the low beam, by controlling the head lamp depending on a position of a preceding vehicle or an oncoming vehicle detected by the vehicle exterior information detection unit 12030.

The audio image output unit 12052 transmits at least one of audio and image output signals to an output device capable of visually or aurally notifying an occupant in the vehicle or the outside of the vehicle of information. In the example of FIG. 22, as the output device, an audio speaker 12061, a display unit 12062, and an instrument panel 12063 are illustrated. The display unit 12062 may include, for example, at least one of an on-board display or a head-up display.

Figure 23:
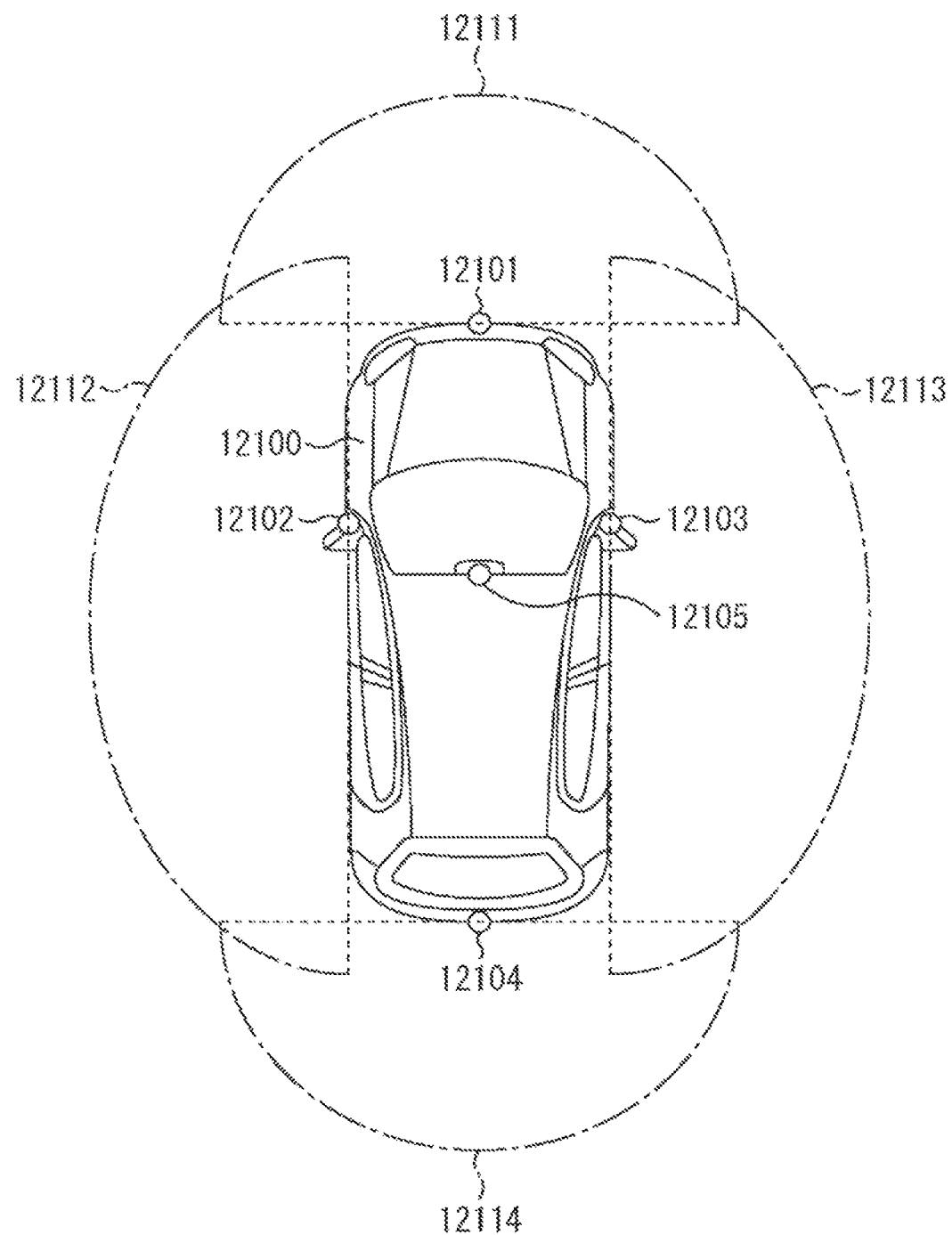
FIG. 23 is an explanatory diagram illustrating an example of installation positions of a vehicle exterior information detecting unit and an imaging unit.

FIG. 23 is a diagram illustrating an example of installation positions of the imaging unit 12031.

In FIG. 23, a vehicle 12100 includes imaging units 12101, 12102, 12103, 12104, and 12105 as the imaging unit 12031.

The imaging units 12101, 12102, 12103, 12104, and 12105 are provided, for example, at a position of the front nose, the side mirror, the rear bumper, the back door, the upper part of the windshield in the vehicle interior, or the like, of a vehicle 12100. The imaging unit 12101 provided at the front nose and the imaging unit 12105 provided at the upper part of the windshield in the vehicle interior mainly acquire images ahead of the vehicle 12100. The imaging units 12102 and 12103 provided at the side mirrors mainly acquire images on the sides of the vehicle 12100. The imaging unit 12104 provided at the rear bumper or the back door mainly acquires an image behind the vehicle 12100. The front images acquired by the imaging units 12101 and 12105 are mainly used for detection of a preceding vehicle, a pedestrian, an obstacle, a traffic signal, a traffic sign, a lane, or the like.

Note that, FIG. 23 illustrates an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side mirrors, an imaging range 12114 indicates an imaging range of the imaging unit 12104 provided at the rear bumper or the back door. For example, image data captured by the imaging units 12101 to 12104 are superimposed on each other, whereby an overhead image is obtained of the vehicle 12100 viewed from above.

At least one of the imaging units 12101 to 12104 may have a function of acquiring distance information. For example, at least one of the imaging units 12101 to 12104 may be a stereo camera including a plurality of imaging elements, or may be an imaging element including pixels for phase difference detection.

For example, on the basis of the distance information obtained from the imaging units 12101 to 12104, the microcomputer 12051 obtains a distance to each three-dimensional object within the imaging ranges 12111 to 12114, and a temporal change of the distance (relative speed to the vehicle 12100), thereby being able to extract, as a preceding vehicle, a three-dimensional object that is in particular a closest three-dimensional object on a traveling path of the vehicle 12100 and traveling at a predetermined speed (for example, greater than or equal to 0 km/h) in substantially the same direction as that of the vehicle 12100. Moreover, the microcomputer 12051 can set an inter-vehicle distance to be ensured in advance in front of the preceding vehicle, and can perform automatic brake control (including follow-up stop control), automatic acceleration control (including follow-up start control), and the like. As described above, it is possible to perform cooperative control aiming for automatic driving that autonomously travels without depending on operation of the driver, or the like.

For example, on the basis of the distance information obtained from the imaging units 12101 to 12104, the microcomputer 12051 can extract three-dimensional object data regarding the three-dimensional object by classifying the objects into a two-wheeled vehicle, a regular vehicle, a large vehicle, a pedestrian, and other three-dimensional objects such as a utility pole, and use the data for automatic avoidance of obstacles. For example, the microcomputer 12051 identifies obstacles in the periphery of the vehicle 12100 into an obstacle visually recognizable to the driver of the vehicle 12100 and an obstacle difficult to be visually recognized. Then, the microcomputer 12051 determines a collision risk indicating a risk of collision with each obstacle, and when the collision risk is greater than or equal to a set value and there is a possibility of collision, the microcomputer 12051 outputs an alarm to the driver via the audio speaker 12061 and the display unit 12062, or performs forced deceleration or avoidance steering via the drive system control unit 12010, thereby being able to perform driving assistance for collision avoidance.

At least one of the imaging units 12101 to 12104 may be an infrared camera that detects infrared rays. For example, the microcomputer 12051 can recognize a pedestrian by determining whether or not a pedestrian exists in the captured images of the imaging units 12101 to 12104. Such pedestrian recognition is performed by, for example, a procedure of extracting feature points in the captured images of the imaging units 12101 to 12104 as infrared cameras, and a procedure of performing pattern matching processing on a series of feature points indicating a contour of an object to determine whether or not the object is a pedestrian. When the microcomputer 12051 determines that a pedestrian exists in the captured images of the imaging units 12101 to 12104 and recognizes the pedestrian, the audio image output unit 12052 controls the display unit 12062 so that a rectangular contour line for emphasis is superimposed and displayed on the recognized pedestrian. Furthermore, the audio image output unit 12052 may control the display unit 12062 so that an icon or the like indicating the pedestrian is displayed at a desired position.

In the above, an example has been described of the vehicle control system to which the technology according to the present disclosure can be applied. The technology according to the present disclosure can be applied to the vehicle exterior information detection unit 12030 and the imaging unit 12031 among the configurations described above. Specifically, the light receiving element 1 or the distance measurement module 500 can be applied to a distance detection processing block of the vehicle exterior information detection unit 12030 and the imaging unit 12031. By applying the technology according to the present disclosure to the vehicle exterior information detection unit 12030 and the imaging unit 12031, it is possible to measure a distance to an object such as a person, a car, an obstacle, a sign, or a character on a road surface with high accuracy, and by using the obtained distance information, it is possible to reduce fatigue of the driver and improve safety levels of the driver and the vehicle.

The embodiment of the present technology is not limited to the embodiments described above, and various modifications are possible without departing from the gist of the present technology.

Furthermore, in the light receiving element 1 described above, an example has been described in which an electron is used as a signal carrier; however, a hole generated by photoelectric conversion may be used as a signal carrier. In such a case, it is sufficient that the photoelectric conversion region includes the P-type semiconductor region, the semiconductor substrate 70 includes the N-type semiconductor region, and a hole as a signal carrier is detected in the photoelectric conversion region.

In the light receiving element 1 described above, the electric charge transferred from the photodiode PD is held in the floating diffusion regions FD1 and FD2; however, a memory unit may be formed as the charge holding unit to hold the electric charge.

For example, in the light receiving element 1 described above, a mode can be adopted in which some or all of the embodiments are combined.

The light receiving element 1 described above may be configured as a single chip by itself, or may be configured in any form such as a module or a distance measurement device packaged with a light source, an optical system, a signal processing circuit, and the like.

Note that, the effects described in the present specification are merely examples and are not limited, and may have effects other than those described in the present specification.

Note that, the present technology can also be configured as described below.

(1)

A light receiving element including
a pixel at least including:
a first charge holding unit and a second charge holding unit each of which holds an electric charge generated by a photodiode;
a first transfer transistor that transfers the electric charge to the first charge holding unit; and
a second transfer transistor that transfers the electric charge to the second charge holding unit, in which
the first and second transfer transistors each include a vertical transistor including a vertical gate electrode portion.

(2)

The light receiving element according to (1), in which
the first charge holding unit and the second charge holding unit are arranged to face each other with the photodiode interposed therebetween.

(3)

The light receiving element according to (1) or (2), in which
a distance between the first transfer transistor and the second transfer transistor is shorter than a gate width of the first or second transfer transistor.

(4)

The light receiving element according to any of (1) to (3), in which
gate widths of the first and second transfer transistors are greater than a width of the photodiode in a direction identical to a direction of the gate widths.

(5)

The light receiving element according to any of (1) to (4), in which
the first and second transfer transistors each include a plurality of vertical gate electrode portions.

(6)

The light receiving element according to (5), in which
the first and second transfer transistors are each formed in a comb-teeth shape in a cross-sectional view.

(7)

The light receiving element according to any of (1) to (6), in which
a planar shape of the vertical gate electrode portion is formed in an elongated shape having a second width in a direction orthogonal to a gate width direction longer than a first width in the gate width direction.

(8) The light receiving element according to (7), in which the planar shape of the vertical gate electrode portion is formed in the elongated shape convex on the photodiode's side.

(9) The light receiving element according to any of (1) to (8), in which an N-type or P-type semiconductor region forming a photoelectric conversion region of the photodiode is formed between the vertical gate electrode portions of the first and second transfer transistors, and in a region below the vertical gate electrode portion, and a depletion layer is expanded to a vicinity of a substrate interface on an opposite side from a formation surface of the first and second transfer transistors.

(10) The light receiving element according to any of (1) to (9), in which the pixel further includes:
a first additional capacitance that stores the electric charge;
a first connection transistor that connects the first additional capacitance to the first charge holding unit;
a second additional capacitance that stores the electric charge; and
a second connection transistor that connects the second additional capacitance to the second charge holding unit.

(11) The light receiving element according to any of (1) to (10), in which the pixel further includes:
a third charge holding unit that holds the electric charge;
a third transfer transistor that transfers the electric charge to the third charge holding unit;
a fourth charge holding unit that holds the electric charge; and
a fourth transfer transistor that transfers the electric charge to the fourth charge holding unit, and
the third and fourth transfer transistors each include a vertical transistor including a vertical gate electrode portion.

(12) The light receiving element according to any of (1) to (11), in which when the first transfer transistor is turned on and the electric charge is transferred to the first charge holding unit, a second negative bias greater than a first negative bias is applied to the second transfer transistor facing the first transfer transistor, and the first negative bias is applied to the third transfer transistor and the fourth transfer transistor.

(13) The light receiving element according to any of (1) to (10), in which when the first transfer transistor is turned on and the electric charge is transferred to the first charge holding unit, a negative bias is applied to the second transfer transistor.

(14) The light receiving element according to (13), in which the negative bias is a negative bias greater than a negative bias for pinning.

(15) A distance measurement module including:
a light receiving element including a pixel at least including
a first charge holding unit and a second charge holding unit each of which holds an electric charge generated by a photodiode,
a first transfer transistor that transfers the electric charge to the first charge holding unit, and
a second transfer transistor that transfers the electric charge to the second charge holding unit, in which
the first and second transfer transistors each include a vertical transistor including a vertical gate electrode portion;
a light source that emits irradiation light whose brightness fluctuates periodically; and
a light emission control unit that controls an irradiation timing of the irradiation light.

(16) An electronic device including
a light receiving element including
a pixel at least including:
a first charge holding unit and a second charge holding unit each of which holds an electric charge generated by a photodiode;
a first transfer transistor that transfers the electric charge to the first charge holding unit; and
a second transfer transistor that transfers the electric charge to the second charge holding unit, in which
the first and second transfer transistors each include a vertical transistor including a vertical gate electrode portion.

REFERENCE SIGNS LIST

1 Light receiving element
10 Pixel
21 Pixel array unit
FD1, FD2 Floating diffusion region
FDG1, FDG2 Switching transistor
FDL1, FDL2 Additional capacitance
PD Photodiode
RST1, RST2 Reset transistor
SEL1, SEL2 Selection transistor
TRG1, TRG2 Transfer transistor
42 Gate electrode
42T Planar gate electrode portion
42V Vertical gate electrode portion
61 Gate width
500 Distance measurement module
511 Light emitting unit
512 Light emission control unit
513 Light receiving unit
601 Smartphone
602 Distance measurement module

The invention claimed is:
1. A light receiving element, comprising:
a pixel, including:
a first charge holding unit and a second charge holding unit, each of which holds an electric charge generated by a photodiode;
a first transfer transistor that transfers the electric charge to the first charge holding unit, wherein the first transfer transistor includes a vertical transistor including a vertical gate electrode portion, and wherein a planar shape of the vertical gate electrode portion of the vertical transistor of the first transfer transistor is formed in an elongated shape having a second width in a direction orthogonal to a gate width direction longer than a first width in the gate width direction; and a second transfer transistor that transfers the electric charge to the second charge holding unit, wherein the second transfer transistor includes a vertical transistor including a vertical gate electrode portion, and wherein a planar shape of the vertical gate electrode portion of the vertical transistor of the second transfer transistor is formed in an elongated shape having a second width in a direction orthogonal to a gate width direction longer than a first width in the gate width direction.

2. The light receiving element according to claim 1, wherein
the first charge holding unit and the second charge holding unit are arranged to face each other with the photodiode interposed therebetween.

3. The light receiving element according to claim 1, wherein
a distance between the first transfer transistor and the second transfer transistor is shorter than a gate width of the first or second transfer transistor.

4. The light receiving element according to claim 1, wherein
gate widths of the first and second transfer transistors are greater than a width of the photodiode in a direction identical to a direction of the gate widths.

5. The light receiving element according to claim 1, wherein
the first and second transfer transistors each include a plurality of vertical gate electrode portions.

6. The light receiving element according to claim 5, wherein
the first and second transfer transistors are each formed in a comb-teeth shape in a cross-sectional view.

7. The light receiving element according to claim 1, wherein
an N-type or P-type semiconductor region forming a photoelectric conversion region of the photodiode is formed between the vertical gate electrode portions of the first and second transfer transistors, and in a region below the vertical gate electrode portions of the first and second transfer transistors, and a depletion layer is expanded to a vicinity of a side of a substrate on an opposite side of the substrate from side of the substrate that is a formation surface of the first and second transfer transistors.

8. The light receiving element according to claim 1, wherein
the pixel further includes:
a third charge holding unit that holds the electric charge;
a third transfer transistor that transfers the electric charge to the third charge holding unit;
a fourth charge holding unit that holds the electric charge; and
a fourth transfer transistor that transfers the electric charge to the fourth charge holding unit,
wherein the third and fourth transfer transistors each include a vertical transistor including a vertical gate electrode portion.

9. The light receiving element according to claim 8, wherein
when the first transfer transistor is turned on and the electric charge is transferred to the first charge holding unit, a second negative bias greater than a first negative bias is applied to the second transfer transistor facing the first transfer transistor, and the first negative bias is applied to the third transfer transistor and the fourth transfer transistor.

10. The light receiving element according to claim 1, wherein
when the first transfer transistor is turned on and the electric charge is transferred to the first charge holding unit, a negative bias is applied to the second transfer transistor.

11. The light receiving element according to claim 1, wherein
the planar shape of the vertical gate electrode portion is formed in the elongated shape convex on a side of the photodiode.

12. A light receiving element, comprising:
a pixel, including:
a first charge holding unit and a second charge holding unit each of which holds an electric charge generated by a photodiode;
a first transfer transistor that transfers the electric charge to the first charge holding unit, wherein the first transfer transistor includes a vertical transistor including a vertical gate electrode portion;
a second transfer transistor that transfers the electric charge to the second charge holding unit, wherein the second transfer transistor includes a vertical transistor including a vertical gate electrode portion;
a first additional capacitance that stores the electric charge;
a first connection transistor that connects the first additional capacitance to the first charge holding unit;
a second additional capacitance that stores the electric charge; and
a second connection transistor that connects the second additional capacitance to the second charge holding unit.

13. The light receiving element according to claim 12, wherein
a planar shape of the vertical gate electrode portion is formed in an elongated shape having a second width in a direction orthogonal to a gate width direction longer than a first width in the gate width direction.

14. The light receiving element according to claim 13, wherein
the planar shape of the vertical gate electrode portion is formed in the elongated shape convex on a side of the photodiode.

15. The light receiving element according to claim 12, wherein
the first charge holding unit and the second charge holding unit are arranged to face each other with the photodiode interposed therebetween.

16. The light receiving element according to claim 12, wherein
a distance between the first transfer transistor and the second transfer transistor is shorter than a gate width of the first or second transfer transistor.

17. The light receiving element according to claim 12, wherein
gate widths of the first and second transfer transistors are greater than a width of the photodiode in a direction identical to a direction of the gate widths.

18. The light receiving element according to claim 12, wherein
the first and second transfer transistors each include a plurality of vertical gate electrode portions.

19. An electronic device, comprising:
a light receiving element, including:
- a pixel at least including:
    - a first charge holding unit and a second charge holding unit, each of which holds an electric charge generated by a photodiode;
    - a first transfer transistor that transfers the electric charge to the first charge holding unit, wherein the first transfer transistor includes a vertical transistor including a vertical gate electrode portion, and wherein a planar shape of the vertical gate electrode portion of the vertical transistor of the first transfer transistor is formed in an elongated shape having a second width in a direction orthogonal to a gate width direction longer than a first width in the gate width direction; and
    - a second transfer transistor that transfers the electric charge to the second charge holding unit, wherein the second transfer transistor includes a vertical transistor including a vertical gate electrode portion, and
- wherein a planar shape of the vertical gate electrode portion of the vertical transistor of the second transfer transistor is formed in an elongated shape having a second width in a direction orthogonal to a gate width direction longer than a first width in the gate width direction.

20. The electronic device of claim 19, further comprising:
a light source that emits irradiation light whose brightness fluctuates periodically; and
a light emission control unit that controls an irradiation timing of the irradiation light.

* * * * *